United States Patent
Preikszas et al.

(10) Patent No.: US 10,699,869 B2
(45) Date of Patent: Jun. 30, 2020

(54) OPERATING A PARTICLE BEAM APPARATUS

(71) Applicant: Carl Zeiss Microscopy GmbH, Jena (DE)

(72) Inventors: Dirk Preikszas, Oberkochen (DE); Gero Walter, Westhausen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/278,896

(22) Filed: Feb. 19, 2019

(65) Prior Publication Data
US 2019/0318905 A1 Oct. 17, 2019

(30) Foreign Application Priority Data
Feb. 22, 2018 (DE) .................... 10 2018 202 728

(51) Int. Cl.
| | | |
|---|---|---|
| *H01J 37/12* | (2006.01) | |
| *H01J 37/06* | (2006.01) | |
| *H01J 37/28* | (2006.01) | |
| *H01J 37/147* | (2006.01) | |
| *H01J 37/08* | (2006.01) | |
| *H01J 37/22* | (2006.01) | |
| *H01J 37/26* | (2006.01) | |

(52) U.S. Cl.
CPC .............. *H01J 37/12* (2013.01); *H01J 37/06* (2013.01); *H01J 37/08* (2013.01); *H01J 37/1471* (2013.01); *H01J 37/22* (2013.01); *H01J 37/265* (2013.01); *H01J 37/28* (2013.01)

(58) Field of Classification Search
CPC .. H01J 37/06; H01J 37/08; H01J 37/12; H01J 37/1471; H01J 37/22; H01J 37/265; H01J 37/28
See application file for complete search history.

(56) References Cited

U.S. PATENT DOCUMENTS

| | | | |
|---|---|---|---|
| 6,067,164 A  * | 5/2000 | Onoguchi | H01J 37/265 250/310 |
| 6,864,493 B2 | 3/2005 | Sato et al. | |
| 9,208,994 B2 | 12/2015 | Ohshima et al. | |
| 2002/0179851 A1* | 12/2002 | Sato | H01J 37/1471 250/491.1 |

(Continued)

FOREIGN PATENT DOCUMENTS

WO WO 2015/050201 A1 4/2015

*Primary Examiner* — David E Smith
(74) *Attorney, Agent, or Firm* — Muirhead and Saturnelli, LLC

(57) ABSTRACT

A method for operating a particle beam apparatus. An objective lens current may be swept, and a property of a deflection unit and/or of an aperture unit may be set while the objective lens current is swept. Setting the property may implemented in such a way that either an image of the object displayed on a display device does not move or any such movement of the displayed image has a minimal deflection. Moreover, the operating voltage of a beam generator may be swept and the object may be aligned by means of a specimen stage. While the operating voltage is swept, the specimen stage may be moved into an aligned position in such a way that either the image of the object displayed on the display device does not move or any such movement of the displayed image has a minimal deflection.

23 Claims, 14 Drawing Sheets

(56) References Cited

U.S. PATENT DOCUMENTS

| | | | |
|---|---|---|---|
| 2005/0006598 A1* | 1/2005 | Pearl | H01J 37/1471 250/492.1 |
| 2012/0138793 A1* | 6/2012 | Yamada | H01J 37/1471 250/307 |
| 2016/0217969 A1 | 7/2016 | Mizuhara et al. | |

* cited by examiner

OPERATING A PARTICLE BEAM APPARATUS

TECHNICAL FIELD

The system described herein relates to a method for operating a particle beam apparatus. By way of example, the particle beam apparatus is an electron beam apparatus and/or an ion beam apparatus. Moreover, the system described herein relates to a particle beam apparatus for carrying out the method.

BACKGROUND OF THE INVENTION

Electron beam apparatuses, in particular a scanning electron microscope (also referred to as SEM below) and/or a transmission electron microscope (also referred to as TEM below), are used to examine objects (also referred to as specimens) in order to obtain knowledge in respect of the properties and behaviors of the objects under certain conditions.

In an SEM, an electron beam (also referred to as primary electron beam below) is generated by means of a beam generator and focused on an object to be examined by way of a beam-guiding system. An objective lens is used for focusing purposes. The primary electron beam is guided in a raster-shaped manner over a surface of the object to be examined by way of a deflection device. Here, the electrons of the primary electron beam interact with the object to be examined. In particular interaction particles and/or interaction radiation is/are generated as a result of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary beam and they are detected by at least one particle detector. The particle detector may generate detector signals which are used to generate an image of the object. The image is displayed on a display device, for example a monitor. An imaging of the object to be examined is thus obtained.

By way of example, the interaction radiation is x-ray radiation or cathodoluminescence. It is detected for example with a radiation detector and is used in particular for examining the material composition of the object.

In the case of a TEM, a primary electron beam is likewise generated by means of a beam generator and focused on an object to be examined by means of a beam-guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective lens. By way of example, the aforementioned system additionally also may comprise a projection lens. Here, imaging may also take place in the scanning mode of a TEM. As a rule, such a TEM is referred to as STEM. Additionally, provision can be made for detecting electrons scattered back at the object to be examined and/or secondary electrons emitted by the object to be examined by means of a further detector in order to image an object to be examined.

The integration of the function of a STEM and an SEM in a single particle beam apparatus is known. It is therefore possible to carry out examinations of objects with an SEM function and/or with a STEM function using this particle beam apparatus.

Furthermore, the prior art has disclosed the practice of analyzing and/or processing an object in a particle beam apparatus using, on the one hand, electrons and, on the other hand, ions. By way of example, an electron beam column having the function of an SEM is arranged at the particle beam apparatus. Additionally, an ion beam column is arranged at the particle beam apparatus. Ions used for processing an object are generated by means of an ion beam generator arranged in the ion beam column. By way of example, material of the object is ablated or material is applied onto the object during the processing. The ions are used, additionally or alternatively, for imaging. The electron beam column with the SEM function may serve, in particular, for examining further the processed or unprocessed object, but also for processing the object.

The aforementioned particle beam apparatuses of the prior art each have a specimen chamber in which an object that is to be analyzed and/or processed is arranged on a specimen stage. It is furthermore known to arrange a plurality of different objects simultaneously at the specimen stage so as to analyze and/or process them one after the other using the respective particle beam apparatus that has the specimen chamber. The specimen stage is embodied to be movable so as to position the object or objects in the specimen chamber. A relative position of the object or objects with respect to an objective lens is set, for example. A known specimen stage is embodied to be movable in three directions which are arranged perpendicular to one another. Moreover, the specimen stage can be rotated about two rotational axes which are arranged perpendicular to one another.

The aforementioned particle beam apparatuses of the prior art have at least one of the following units for adjusting the particle beam, i.e., for shaping the beam of the particle beam and/or for setting the beam direction of the particle beam: a displaceable aperture unit, an electrostatic deflection unit and a magnetic deflection unit.

The objective lens of the known SEM is discussed in more detail below. The objective lens of the known SEM has pole pieces, a bore being embodied therein. A beam-guiding tube is guided through this bore. At a first end, the beam-guiding tube has an anode, which is arranged lying opposite an electron source. The electrons of the primary electron beam are accelerated to the anode potential due to a potential difference between the electron source and the anode. By way of example, the anode potential is between 1 kV and 20 kV in relation to a ground potential of a housing of the SEM. Further, a coil for generating a magnetic field is arranged in the pole pieces. Moreover, the known objective lens may comprise a termination electrode, which has a first side and a second side. The first side of the termination electrode is directed in the direction of the object. The second side of the termination electrode is directed in the direction of a tube electrode, which forms a second end of the beam-guiding tube. The termination electrode and the tube electrode form an electrostatic retardation device. This is because provision is made in the known objective lens for the tube electrode, together with the beam-guiding tube, to lie at the potential of the anode of the SEM, while the termination electrode and the object in the SEM lie at a lower potential in relation to the potential of the anode. By way of example, this can be the ground potential of the housing of the SEM. As an alternative thereto, the object and the termination electrode can also lie at different potentials; however, these are both lower than the potential of the anode. Consequently, the known objective lens has a first electric field between the beam-guiding tube and the termination electrode and a second electric field between the termination electrode and the object. On account of the electrostatic retardation device, the electrons of the primary electron beam are decelerated to a desired energy that is required for examining the object.

In order to obtain good imaging of the object—i.e., imaging with a good resolution and a desired contrast—with the known SEM, the object should be aligned by means of the specimen stage in such a way that the second electric field between the object and the termination electrode is as rotationally symmetric as possible. If the area of the object to be imaged with the SEM is virtually plane, this area should be aligned parallel to the termination electrode in order to achieve the aforementioned object. However, as a rule, the area of the object to be imaged is not plane. In order to obtain good imaging in this case, too, the practice of sweeping an object voltage applied to the object and, at the same time, aligning the object by tilting the specimen stage while this object voltage is swept is known. Here, sweeping the object voltage of the object is understood to mean that the object voltage applied to the object is set to an object voltage value and this object voltage value is subsequently changed periodically. During the aforementioned sweeping of the object voltage, the object is aligned in such a way by tilting the specimen stage that either the image of the object displayed on the display device does not move or any such movement of the displayed image has a minimal deflection. The above-described procedure, i.e., sweeping the object voltage applied to the object and, by tilting the specimen stage, aligning the object into a position in which the image has a minimum deflection or does not move, leads to the deflecting effect of the second electric field between the termination electrode and the object being neutralized.

However, the above-described procedure does not take account of, firstly, the first electric field between the beam-guiding tube and the termination electrode and, secondly, the magnetic field generated by the objective lens. However, the first electric field and the magnetic field should also be taken into account; otherwise, the primary electron beam is deflected by both the first electric field and the magnetic field in such a way that good imaging is not obtainable. The practice of sweeping the cathode voltage of the electron source for the purposes of taking account of the first electric field is known. Expressed differently, the cathode voltage is set to a cathode voltage value. Subsequently, the cathode voltage value is periodically changed. During the aforementioned sweep of the cathode voltage, the primary electron beam guided in the direction of the object is aligned by displacing the aperture unit and/or by a deflection by means of an electrostatic and/or magnetic deflection unit in such a way that either the image of the object displayed on the display device does not move or any such movement of the displayed image has a minimal deflection. As an alternative thereto, the objective lens current is swept for the purposes of taking account of the magnetic field. Expressed differently, the objective lens current of the objective lens is set to a current value. Subsequently, the current value is periodically changed. Here, too, during the aforementioned sweep of the objective lens current, the primary electron beam guided in the direction of the object is aligned by displacing the aperture unit and/or by a deflection by means of an electrostatic and/or magnetic deflection unit in such a way that either the image of the object displayed on the display device does not move or any such movement of the displayed image has a minimal deflection. However, neither the first electric field nor the magnetic field always has the same axis of symmetry on account of mechanical tolerances in the SEM and on account of magnetic inhomogeneity. Therefore, the two aforementioned fields both deflect the primary electron beam, in each case on their own. Therefore, good imaging with a desired resolution and with a desired contrast is not obtainable despite the above-described procedure since the primary electron beam extends neither along a desired axis of symmetry of the first electric field nor along a desired axis of symmetry of the magnetic field.

If an objective lens in the form of an electrostatic round lens is manufactured perfectly, the latter has one axis of symmetry, namely the rotation axis. An electron of a primary particle beam moves without being deflected along this axis of symmetry. However, producing a perfectly manufactured electrostatic round lens is difficult. Electrostatic round lenses are often not manufactured perfectly. Therefore, an axis of symmetry denoted as an axis of symmetry of these electrostatic round lenses is often only a desired intended axis of symmetry which does not really exist in the actually produced electrostatic round lenses. In the case of a magnetic round lens, as a rule, inhomogeneities in the magnetic material cause the magnetic field not to be symmetrical in relation to the desired intended axis of symmetry. The following is obtained during sweeping: If an electron of the primary electron beam is situated at a start point in the region between the objective lens and the electron source, the direction at which the electron enters the objective lens can be adjusted by means of the aperture unit and the electrostatic and/or magnetic deflection units. If the integrated deflection that is caused by the entire objective lens is zero at the object, the objective lens current can be swept without an impact point of the electron on the object changing in a linear and quasi-static approximation. In practice, there are minor changes around the impact point in that case.

SUMMARY OF THE INVENTION

Described herein is a system for imaging an object using a particle beam apparatus, including methods of imaging an object using a particle beam apparatus and a particle beam apparatus for carrying out the methods, in which imaging with a good resolution and a desired contrast are obtainable.

A method according to an embodiment of the system described herein is provided for operating a particle beam apparatus. By way of example, the particle beam apparatus may be embodied to image, analyze and/or process an object. In particular, the particle beam apparatus may be embodied as an electron beam apparatus and/or as an ion beam apparatus. Provision may be made in particular for the particle beam apparatus to have a beam generator for generating a particle beam with charged primary particles. By way of example, the primary particles may be electrons or ions. Further, the particle beam apparatus may have an objective lens, for example, which may generate, firstly, a magnetic field and, secondly, an electric field between the objective lens and the object. The objective lens may serve to focus the particle beam on the object. Interaction particles and/or interaction radiation arise/arises in the case of an interaction between the particle beam and the object. The interaction particles may be, for example, secondary particles, in particular secondary electrons, and/or backscattered particles, for example backscattered electrons. By way of example, the interaction radiation may be x-ray radiation or cathodoluminescence. The particle beam apparatus may have at least one adjustable deflection unit for deflecting the particle beam.

Additionally or alternatively, the particle beam apparatus may have an adjustable aperture unit for shaping the particle beam. Expressed differently, the aperture unit selects a partial beam with a suitable direction from a large particle beam bundle. In particular, provision may be made for a single unit to be embodied both as deflection unit and as aperture unit. By way of example, the deflection unit may have electrostatic deflection units and/or magnetic deflection units. By way of example, the aperture unit may be embodied as a mechanically displaceable aperture unit. Further, the particle beam apparatus may have, for example, a movable specimen stage for arranging the object in the particle beam apparatus. The specimen stage may be embodied to be movable in such a way that the object is positionable in the particle beam apparatus. By way of example, the specimen stage may be arranged in a specimen chamber of the particle beam apparatus. In particular, provision may be made for the specimen stage to have a movable embodiment in three directions that may be arranged perpendicular to one another.

Additionally, the specimen stage may be rotated about two axes that may be arranged perpendicular to one another. Moreover, for example, the particle beam apparatus according to an embodiment of the system described herein may have at least one detector for detecting the interaction particles and/or interaction radiation and for generating detector signals. Further, for example, the particle beam apparatus may have at least one display device for displaying an image of the object, wherein the image may be generated by means of the detector signals. Further, for example, the particle beam apparatus may comprise at least one objective lens control unit for supplying the objective lens with an objective lens current and for setting the objective lens current. Additionally, for example, the particle beam apparatus may have at least one beam generator control unit for supplying the beam generator with an operating voltage and for setting the operating voltage. By way of example, the operating voltage may be the cathode voltage of the beam generator.

The objective lens current may be swept according to an embodiment of the system described herein. Expressed differently, the objective lens current may be set to a current value by means of the objective lens control unit. Then, there may be a periodic change in the current value of the objective lens current by way of the objective lens control unit. At least one property of the deflection unit and/or of the aperture unit may be set during the periodic change in the current value of the objective lens current. By way of example, the aforementioned property may be a position, which may be set, of the deflection unit and/or of the aperture unit in the particle beam apparatus. There may be deflection as a result of setting the position of the deflection unit and there may be shaping of the particle beam by setting the position of the aperture unit. In addition or as an alternative thereto, at least one actuation variable for supplying the deflection unit may be set as a property of the deflection unit. If the deflection unit comprises electrostatic and/or magnetic components, the actuation variable may be a voltage or a current, for example. Setting at least one of the aforementioned properties may be implemented in such a way that either the image of the object displayed on the display device does not move or any such movement of the displayed image has a minimal deflection. By way of example, the deflection from a predeterminable zero on the display device may be determined. Expressed differently, setting at least one of the aforementioned properties may be implemented until either the image of the object displayed on the display device does not move or any such movement of the displayed image has a minimal deflection.

Moreover, the operating voltage of the beam generator may be swept and the object may be aligned by means of the specimen stage according to an embodiment of the system described herein. By way of example, these steps may be implemented after the aforementioned steps, namely sweeping the objective lens current and setting at least one of the aforementioned properties of the deflection unit and/or the aperture unit. Sweeping of the operating voltage of the beam generator may comprise setting the operating voltage of the beam generator to a voltage value by means of the beam generator control unit. Then, there may be a periodic change in the voltage value of the operating voltage by way of the beam generator control unit. During the periodic change in the voltage value of the operating voltage, the specimen stage may be moved into an aligned position in such a way that either the image of the object displayed on the display device does not move or any such movement of the displayed image has a minimal deflection. By way of example, the deflection from the predeterminable zero on the display device may be determined, once again.

Therefore, according to an embodiment of the system described herein, the magnetic field generated by the objective lens may be taken into account in a first step. On account of setting at least one of the aforementioned properties of the deflection unit and/or aperture unit, the particle beam extends along a desired intended axis of symmetry of the magnetic field. Since the particle beam now already may be guided along the desired intended axis of symmetry, and hence in a center of the magnetic field, only an asymmetry in the electric field of the objective lens causes a displacement, still present, of the image on the display device when sweeping the operating voltage. The electric field would cause displacement even if the symmetry of the electric field were inherently perfect since the symmetry of the electric field deviates from the symmetry of the magnetic field present. Now, the electric field may be changed between objective lens and object in a second step of a method according to an embodiment of the system described herein by aligning the specimen stage (and hence by aligning the object in the particle beam apparatus). As a result of this change, the overall deflection of the particle beam by the electric field may be neutralized. The aforementioned method steps, i.e., sweeping the objective lens current and setting the at least one property of the deflection unit and/or the aperture unit, and also sweeping the operating voltage of the beam generator and aligning the specimen stage, can be repeated multiple times until there is no deflection, or only a minimal deflection, of the image on the display device. Methods according to embodiments of the system described herein can be carried out manually or in automated fashion. A good resolution and a desired contrast may be obtained with methods according to embodiments of the system described herein.

By way of example, according to an embodiment of the system described herein, the specimen stage may be tilted about at least one of the two axes.

In one embodiment of the system described herein, provision is additionally or alternatively made for the operating voltage to be supplied to a cathode of the beam generator and for the operating voltage in the form of a cathode voltage to be set by the beam generator control unit.

In an even further embodiment of the system described herein, provision is additionally or alternatively made for a controllable object voltage to be applied to the object. By way of example, the controllable object voltage of the object can also be swept. Expressed differently, the controllable object voltage of the object may be set to an object voltage value. Then, there may be a periodic change in the object voltage value of the controllable object voltage. During the periodic change in the object voltage value of the controllable object voltage, the specimen stage may be moved in such a way that either the image of the object displayed on the display device does not move or any such movement of the image that may be displayed on the display device has a minimal deflection. By way of example, the deflection from the predeterminable zero on the display device may be determined, once again.

An embodiment of the system described herein also relates to a further method for operating a particle beam apparatus. By way of example, the particle beam apparatus may be embodied to image, analyze and/or process an object. In particular, the particle beam apparatus may be embodied as an electron beam apparatus and/or as an ion beam apparatus. By way of example, provision may be made for the particle beam apparatus to have a beam generator for generating a particle beam comprising charged primary particles. By way of example, the primary particles may be electrons or ions. Further, the particle beam apparatus may have an objective lens with at least one termination electrode, for example. By way of example, the termination electrode may be arranged opposite the object in the particle beam apparatus. The objective lens may generate, firstly, a magnetic field and, secondly, an electric field between the termination electrode and the object. The objective lens may serve to focus the particle beam onto the object. Interaction particles and/or interaction radiation arise/arises in the case of an interaction between the particle beam and the object. The interaction particles may be, for example, secondary particles, in particular secondary electrons, and/or backscattered particles, for example backscattered electrons. By way of example, the interaction radiation may be x-ray radiation or cathodoluminescence. The particle beam apparatus may have at least one adjustable deflection unit for deflecting the particle beam.

Additionally or alternatively, the particle beam apparatus may have an adjustable aperture unit for shaping the particle beam. Expressed differently, the aperture unit selects a partial beam with a suitable direction from a large particle beam bundle. In particular, provision may be made for a single unit to be embodied both as deflection unit and as aperture unit. By way of example, the deflection unit may have electrostatic deflection units and/or magnetic deflection units. By way of example, the aperture unit may be embodied as a mechanically displaceable aperture unit. Further, the particle beam apparatus may have, for example, a movable specimen stage for arranging the object in the particle beam apparatus. The specimen stage may be embodied to be movable in such a way that the object is positionable in the particle beam apparatus. By way of example, the specimen stage may be arranged in a specimen chamber of the particle beam apparatus. By way of example, the specimen stage may be embodied to be movable in three directions which may be arranged perpendicular to one another.

Additionally, the specimen stage can be rotated about two axes that may be arranged perpendicular to one another. Moreover, for example, the particle beam apparatus according to an embodiment of the system described herein may have at least one detector for detecting the interaction particles and/or interaction radiation and for generating detector signals. Further, for example, the particle beam apparatus may comprise at least one display device for displaying an image of the object, wherein the image may be generated by means of the detector signals. Further, for example, the particle beam apparatus may have at least one objective lens control unit for supplying the objective lens with an objective lens current and for setting the objective lens current. Additionally, for example, the particle beam apparatus may have at least one termination electrode control unit for supplying the termination electrode with a termination electrode voltage and for setting the termination electrode voltage.

In an embodiment of the system described herein, the objective lens current may be swept. Expressed differently, the objective lens current may be set to a current value by means of the objective lens control unit. Then, there may be a periodic change in the current value of the objective lens current by way of the objective lens control unit. At least one property of the deflection unit and/or of the aperture unit may be set during the periodic change in the current value of the objective lens current. By way of example, the aforementioned property may be a position, which may be set, of the deflection unit and/or of the aperture unit in the particle beam apparatus. The particle beam may be deflected by setting the position of the deflection unit. The particle beam may be formed by setting the position of the aperture unit. In addition or as an alternative thereto, at least one actuation variable for supplying the deflection unit may be set as a property of the deflection unit. If the deflection unit comprises electrostatic and/or magnetic components, the actuation variable may be a voltage or a current, for example. Setting at least one of the aforementioned properties may be implemented in such a way that either the image of the object displayed on the display device does not move or any such movement of the displayed image may have a minimal deflection. By way of example, the deflection from a predeterminable zero on the display device may be determined. Expressed differently, setting at least one of the aforementioned properties may be implemented until either the image of the object displayed on the display device does not move or any such movement of the displayed image may have a minimal deflection.

Moreover, the termination electrode voltage of the termination electrode may be swept according to an embodiment of the system described herein. Expressed differently, the termination electrode voltage of the termination electrode may be set to a termination electrode voltage value by means of the termination electrode control unit. Then, there may be a periodic change in the termination electric voltage value by way of the termination electrode control unit. During the periodic change in the termination electrode voltage value, the specimen stage may be moved into an aligned position in such a way that either the image of the object displayed on the display device does not move or any such movement of the displayed image may have a minimal deflection. By way of example, the deflection from a predeterminable zero on the display device may be determined.

By way of example, according to an embodiment of the system described herein, the specimen stage may be tilted about at least one of the two axes.

Therefore, in the further method according to an embodiment of the system described herein, the magnetic field generated by the objective lens may be taken into account in a first step. On account of setting at least one of the aforementioned properties of the deflection unit and/or aperture unit, the particle beam extends along a desired intended axis of symmetry of the magnetic field. Since the particle beam now already may be guided along the desired intended axis of symmetry, and hence in a center of the magnetic field, only an asymmetry in the electric field of the objective lens causes a displacement, still present, of the image on the display device when sweeping the termination electrode voltage, if the termination electrode voltage is swept. Now, the electric field may be changed between termination electrode and object in a second step of the further method according to an embodiment of the system described herein by aligning the specimen stage (and hence by aligning the object in the particle beam apparatus). As a result of this change, the overall deflection of the particle beam by the electric field may be neutralized.

The aforementioned method steps, i.e., sweeping the objective lens current, setting the at least one property of the deflection unit and/or the aperture unit, sweeping the termination electrode voltage of the termination electrode and aligning the object by moving the specimen stage, can be repeated multiple times until there is no deflection, or only a minimal deflection, of the image on the display device. A method according to an embodiment of the system described herein can be carried out manually or in automated fashion. A good resolution and a desired contrast may be obtained with a method according to an embodiment of the system described herein.

The particle beam apparatus may have more than one termination electrode. By way of example, the aforementioned termination electrode may be a first termination electrode, a first termination electrode voltage being applied thereto. Moreover, the particle beam apparatus may have at least one second termination electrode, for example. By way of example, the second termination electrode may be a second termination electrode of the objective lens. By way of example, the first termination electrode and the second termination electrode may be parts of a termination electrode unit having two halves, namely a first half in the form of the first termination electrode and a second half in the form of the second termination electrode. The termination electrode unit may be referred to as a cap in one embodiment of the particle beam apparatus. By way of example, the second termination electrode may be arranged parallel to the first termination electrode. In a further embodiment of a method for the system described herein, provision may be made for the periodic change in the termination electrode voltage value of the first termination electrode voltage to be implemented with a first amplitude.

Further, a second termination electrode voltage of the second termination electrode may be swept. Expressed differently, the second termination electrode voltage of the second termination electrode of the objective lens may be set to the termination electrode voltage value. In this respect, the first termination electrode voltage and the second termination electrode voltage may have the same termination electrode voltage value. Then, there may be a periodic change in the termination electrode voltage value of the second termination electrode voltage with a second amplitude. By way of example, the first amplitude and the second amplitude differ. During the periodic change in the first termination electrode voltage and the second termination electrode voltage, the specimen stage may be moved in such a way that either the image of the object displayed on the display device does not move or any such movement of the image that may be displayed on the display device has a minimal deflection. By way of example, the deflection from the predeterminable zero on the display device may be determined, once again.

In a further embodiment of a method for the system described herein, provision is additionally or alternatively made for the first amplitude and the second amplitude to be actuated in such a way that the first amplitude and the second amplitude have a different sign. As a result of this, the first electric field between a beam tube of the particle beam apparatus and the second termination electrode and the second electric field between the first termination electrode and the object may be amplified or attenuated together.

In a further embodiment of the further method for the system described herein, provision is additionally or alternatively made for the first termination electrode voltage and the second termination electrode voltage to be set in such a way that the first amplitude and the second amplitude have different values. The values of the first amplitude and of the second amplitude determine the change in the deflective effect of the first electric field and of the second electric field.

In a yet further embodiment of the further method for the system described herein, provision is additionally or alternatively made for the first amplitude to be actuated in such a way that the first amplitude has a value of zero. As an alternative thereto, provision may be made for the second amplitude to be actuated in such a way that the second amplitude has a value of zero.

In a further embodiment of the further method for the system described herein, provision is additionally or alternatively made for a controllable object voltage to be applied to the object. By way of example, the controllable object voltage of the object can also be swept. Expressed differently, the controllable object voltage of the object may be set to a value. Then, there may be a periodic change in the value of the controllable object voltage. The specimen stage may be moved during the periodic change in the value of the controllable object voltage. The specimen stage may be moved in such a way that either the image of the object displayed on the display device does not move or any such movement of the image that is displayed on the display device has a minimal deflection. By way of example, the deflection from the predeterminable zero on the display device may be determined, once again.

In an embodiment of the system described herein, another method for operating a particle beam apparatus may be performed. By way of example, the particle beam apparatus may be embodied to image, analyze and/or process an object. In particular, the particle beam apparatus may be embodied as an electron beam apparatus and/or as an ion beam apparatus. By way of example, provision may be made for the particle beam apparatus to have a beam generator for generating a particle beam comprising charged primary particles. By way of example, the primary particles may be electrons or ions. Further, the particle beam apparatus may have an objective lens with at least one termination electrode, for example. By way of example, the termination electrode may be arranged opposite the object in the particle beam apparatus. The objective lens may generate, firstly, a magnetic field and, secondly, an electric field between the termination electrode and the object. The objective lens may serve to focus the particle beam onto the object. Interaction particles and/or interaction radiation arise/arises in the case of an interaction between the particle beam and the object. The interaction particles may be, for example, secondary particles, in particular secondary electrons, and/or backscattered particles, for example backscattered electrons. By way of example, the interaction radiation may be x-ray radiation or cathodoluminescence.

Further, the particle beam apparatus may have, for example, a movable specimen stage for arranging the object in the particle beam apparatus. The specimen stage may be embodied to be movable in such a way that the object may be positionable in the particle beam apparatus. By way of example, the specimen stage may be arranged in a specimen chamber of the particle beam apparatus. By way of example, the specimen stage may be embodied to be movable in three directions which may be arranged perpendicular to one another. Additionally, the specimen stage can be rotated about two axes that may be arranged perpendicular to one another, namely a first axis and a second axis. Moreover, for example, the particle beam apparatus according to an embodiment of the system described herein may have at least one detector for detecting the interaction particles and/or interaction radiation and for generating detector signals. Further, for example, the particle beam apparatus may comprise at least one display device for displaying an image of the object, wherein the image may be generated by means of the detector signals. Moreover, the particle beam apparatus may comprise a control unit for setting a beam parameter. Examples of the beam parameter are specified below.

In the even further method according to an embodiment of the system described herein, reference images may be recorded in a reference position of the specimen stage. In particular, provision may be made for a first reference image of the object to be recorded in the reference position of the specimen stage, with a beam parameter having a reference value. By way of example, the reference value may be a zero value or a zero. Further, a second reference image of the object may be recorded in the reference position of the specimen stage, with the beam parameter having a beam parameter value, which differs from the reference value. Subsequently, an image shift of the second reference image in relation to the first reference image may be calculated. In particular, provision may be made for the image shift to be calculated by means of a cross-correlation.

Further, images of the object may be recorded in a first position of the specimen stage in methods according to embodiments of the system described herein. To this end, provision may be made, in particular, for a first image of the object to be recorded with the beam parameter having the reference value in the first position of the specimen stage. Further, a second image of the object may be recorded in the first position of the specimen stage, with the beam parameter having the beam parameter value, which differs from the reference value. Subsequently, an image shift of the first image in relation to the first reference image and an image shift of the second image in relation to the first reference image may be calculated. By way of example, the calculation may be implemented in each case by means of a cross-correlation.

Further, images of the object may be recorded in a second position of the specimen stage. By way of example, provision may be made for a third image of the object to be recorded with the beam parameter having the reference value in the second position of the specimen stage. Further, a fourth image of the object may be recorded in the second position of the specimen stage, with the beam parameter having the beam parameter value, which differs from the reference value. Moreover, an image shift of the third image in relation to the first reference image and an image shift of the fourth image in relation to the first reference image may be calculated. By way of example, the image shift may be calculated by means of cross-correlation.

In principle, the images of the object may be recorded in different positions of the specimen stage in the aforementioned method steps, firstly at a reference value of the beam parameter and secondly at a beam parameter value of the beam parameter, which differs from the reference value.

In the even further method according to an embodiment of the system described herein, provision may be made for the image shifts of the first and third image, each recorded at the reference value, to be interpolated in relation to the first reference image depending on the position of the specimen stage. Moreover, the image shifts of the second reference image, the second image and the fourth image, each recorded at the beam parameter value, which differs from the reference value, may be interpolated in relation to the first reference image depending on the position of the specimen stage. Further, a target position of the specimen stage may be established, the interpolated image shifts at the reference value and at the beam parameter value being identical at said target position. Subsequently, the particle beam apparatus may be operated with the beam parameter having the reference value, with the specimen stage arranged in the target position.

In one embodiment of the system described herein, the even further method may include at least one of the following steps:
  setting the beam parameter to the reference value;
  setting the beam parameter to the beam parameter value, which differs from the reference value;
  setting the reference position of the specimen stage by rotating the specimen stage about the first axis and/or about the second axis;
  setting the first position of the specimen stage by rotating the specimen stage about the first axis and/or about the second axis; and
  setting the second position of the specimen stage by rotating the specimen stage about the first axis and/or about the second axis.

In a further embodiment of the even further method system described herein, provision is additionally or alternatively made for the control unit to be a beam generator control unit for supplying the beam generator with an operating voltage and for setting the operating voltage, and for the beam parameter to be the operating voltage. By way of example, the operating voltage may be a cathode voltage.

If a deflection of the image may be determined at a new position of the specimen stage, and hence at a new position of the object, the following steps may be carried out in this new position of the specimen stage: A further image of the object may be recorded with the beam parameter which has the reference value. Further, an even further image of the object may be recorded with the beam parameter which may be different from the reference value. Subsequently, an image shift of the further image in relation to the first reference image and an image shift of the even further image in relation to the first reference image may be calculated. By way of example, the calculation may be implemented by means of a cross-correlation. Further, there may be an interpolation of the image shift of the further image in relation to the first reference image depending on the new position of the specimen stage, taking account of the interpolation already specified above and carried out. Moreover, there may be an interpolation of the image shift of the further image in relation to the first reference image depending on the new position of the specimen stage, taking account of the interpolation already specified above and carried out. Further, a further target position of the specimen stage may be established, the interpolated image shifts at the reference value and at the beam parameter value being identical at said target position. Then, the particle beam apparatus may be operated with the beam parameter having the value corresponding to the reference value and with the new target position of the specimen stage.

An embodiment of the system described herein also relates to a computer program product having program code, which may be loadable or loaded into a processor of a particle beam apparatus and, when executed, controls a particle beam apparatus in such a way that a method having at least one of the aforementioned or following features or having a combination of at least two of the aforementioned or following features may be carried out.

An embodiment of the system described herein also relates to a particle beam apparatus for imaging, analyzing and/or for processing an object. In particular, the particle beam apparatus may be embodied as an electron beam apparatus and/or as an ion beam apparatus. By way of example, provision may be made for the particle beam apparatus to have a beam generator for generating a particle beam comprising charged primary particles. By way of example, the primary particles may be electrons or ions. Further, the particle beam apparatus according to an embodiment of the system described herein may have an objective lens with at least one termination electrode. By way of example, the termination electrode may be arranged opposite the object in the particle beam apparatus. The objective lens may generate, firstly, a magnetic field and, secondly, an electric field between the termination electrode and the object. The objective lens may serve to focus the particle beam onto the object. Interaction particles and/or interaction radiation arise/arises in the case of an interaction between the particle beam and the object. The interaction particles may be, for example, secondary particles, in particular secondary electrons, and/or backscattered particles, for example backscattered electrons. By way of example, the interaction radiation may be x-ray radiation or cathodoluminescence. The particle beam apparatus may have at least one adjustable deflection unit for deflecting the particle beam.

Additionally or alternatively, the particle beam apparatus may have an adjustable aperture unit for shaping the particle beam. Expressed differently, the aperture unit selects a partial beam with a suitable direction from a large particle beam bundle. In particular, provision may be made for a single unit to be embodied both as deflection unit and as aperture unit. By way of example, the deflection unit may have electrostatic deflection units and/or magnetic deflection units. By way of example, the aperture unit may be embodied as a mechanically displaceable aperture unit. By way of example, the particle beam apparatus may have a movable specimen stage for arranging the object in the particle beam apparatus. The specimen stage may be embodied to be movable in such a way that the object may be positionable in the particle beam apparatus. By way of example, the specimen stage may be arranged in a specimen chamber of the particle beam apparatus. By way of example, the specimen stage may be embodied to be movable in three directions which may be arranged perpendicular to one another.

Additionally, the specimen stage can be rotated about two axes that may be arranged perpendicular to one another. Moreover, the particle beam apparatus according to an embodiment of the system described herein may have at least one detector for detecting the interaction particles and/or interaction radiation and for generating detector signals. Further, the particle beam apparatus according to an embodiment of the system described herein may comprise at least one display device for displaying an image of the object, wherein the image of the object may be based on the detector signals. Further, for example, the particle beam apparatus may have at least one objective lens control unit for supplying the objective lens with an objective lens current and for setting the objective lens current. Moreover, the particle beam apparatus according to an embodiment of the system described herein additionally or alternatively may have at least one beam generator control unit for supplying the beam generator with an operating voltage and for setting the operating voltage. By way of example, the operating voltage may be a cathode voltage. Moreover, the particle beam apparatus according to an embodiment of the system described herein additionally or alternatively may have at least one termination electrode control unit for supplying the termination electrode with a termination electrode voltage and for setting the termination electrode voltage. Further, the particle beam apparatus according to an embodiment of the system described herein may be provided with a processor, on which a computer program product having one of the aforementioned or following features or having a combination of at least two of the aforementioned or following features may be loaded.

In an embodiment of the particle beam apparatus for the system described herein, provision is additionally or alternatively made for the particle beam apparatus to have an object voltage control unit for supplying the object with an object voltage.

In a further embodiment of the particle beam apparatus for the system described herein, provision is made, additionally or alternatively, for the particle beam apparatus to have at least one corrector for correcting chromatic and/or spherical aberration. By way of example, the corrector may be embodied as a mirror corrector.

As already mentioned above, provision may be additionally or alternatively made in a further embodiment of the particle beam apparatus for the system described herein for the particle beam apparatus to be embodied as an electron beam apparatus and/or as an ion beam apparatus.

In yet a further embodiment of the particle beam apparatus for the system described herein, provision is made, additionally or alternatively, for the beam generator for generating a particle beam comprising charged primary particles to be embodied as a first beam generator for generating a first particle beam comprising first charged primary particles and for the objective lens to be embodied as a first objective lens for focusing the first particle beam onto the object. Furthermore, the particle beam apparatus may have at least one second beam generator for generating a second particle beam comprising second charged primary particles, and at least one second objective lens for focusing the second particle beam onto the object. The second charged primary particles may be electrons or ions, for example.

BRIEF DESCRIPTION OF THE DRAWINGS

The system described herein will be explained in more detail below on the basis of illustrative embodiments using drawings. In the figures.

DESCRIPTION OF VARIOUS EMBODIMENTS

Illustrative embodiments of the system described herein will now be described in relation to the drawings. It should be appreciated that the system described herein is not limited to the following illustrative embodiments, as other embodiments, for example, variations of the following illustrative embodiments, are possible, and intended to fall within the scope of the invention.

Embodiments of the system described herein are now explained in more detail by means of particle beam apparatuses in the form of an SEM and in the form of a combination apparatus, which has an electron beam column and an ion beam column. Reference is explicitly made to the fact that the system described herein may be used in any particle beam apparatus, in particular in every electron beam apparatus and/or in every ion beam apparatus.

Figure 1:
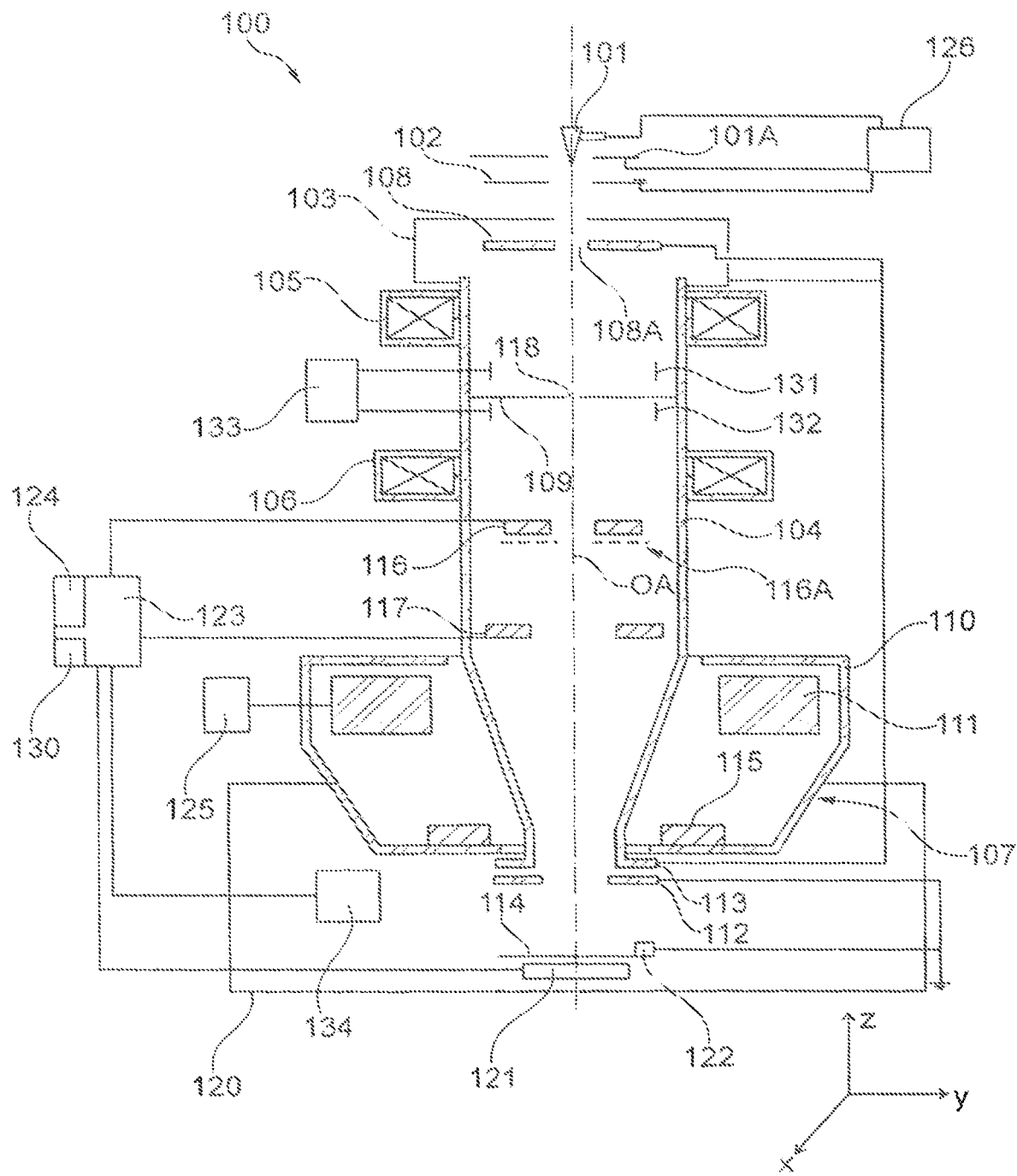
FIG. 1 shows a schematic illustration of a first illustrative embodiment of a particle beam apparatus.

FIG. 1 shows a schematic illustration of an SEM 100. The SEM 100 may comprise a first beam generator with an electron source 101, which is embodied as a cathode. Moreover, the first beam generator may comprise a suppressor electrode 101A and an extraction electrode 102. Further, the SEM 100 is provided with an anode 103, which is placed onto one end of a beam-guiding tube 104 of the SEM 100. By way of example, the electron source 101 is embodied as a thermal field emitter. However, the system described herein is not restricted to such an electron source 101. Rather, any electron source is utilizable.

Electrons emerging from the electron source 101 form a primary electron beam. On account of a potential difference between the electron source 101 and the anode 103, the electrons are accelerated to a predeterminable kinetic energy in relation to a predeterminable potential. In the illustrative embodiment illustrated here, the potential is 1 kV to 20 kV, e.g., 5 kV to 15 kV, in particular 8 kV, in relation to a ground potential of a housing of a specimen chamber 120. However, alternatively it could be at ground potential.

Two condenser lenses, namely a first condenser lens 105 and a second condenser lens 106, are arranged at the beam-guiding tube 104. Here, proceeding from the electron source 101 as viewed in the direction of an objective lens 107, the first condenser lens 105 is arranged first, followed by the second condenser lens 106. Reference is explicitly made to the fact that further illustrative embodiments of the SEM 100 may have only a single condenser lens. A first aperture unit 108 is arranged between the anode 103 and the first condenser lens 105. Together with the anode 103 and the beam-guiding tube 104, the first aperture unit 108 is at a high voltage potential, namely the potential of the anode 103, or it is connected to ground. The first aperture unit 108 has numerous first apertures 108A, of which one is depicted in FIG. 1. Two first apertures 108A are present, for example. Each one of the numerous first apertures 108A has a different aperture diameter. By means of an adjustment mechanism (not depicted), it is possible to set a desired first aperture 108A onto an optical axis OA of the SEM 100. Reference is explicitly made to the fact that, in further illustrative embodiments, the first aperture unit 108 may be provided with only a single aperture 108A. In this illustrative embodiment, an adjustment mechanism may be omitted. The first aperture unit 108 is then designed in a stationary fashion.

A second aperture unit 109 is arranged between the first condenser lens 105 and the second condenser lens 106. A first deflection unit 131 is arranged on a first side of the second aperture unit 109 facing the electron source 101. Further, a second deflection unit 132 is arranged on a second side of the second aperture unit 109 facing the second condenser lens 106. By way of example, both the first deflection unit 131 and the second deflection unit 132 have electrostatic and/or magnetic units, which are adjustable by way of an actuation variable. If the second aperture unit 109 is a displaceable single or multi-aperture unit, use is made, for example, of at least one of the two deflection units 131 and 132. If the second aperture unit 109 is a stationary single aperture, then use is made of at least two deflection units, for example the first deflection unit 131 and the second deflection unit 132. If the second aperture 109 is a stationary multi-aperture unit, use is made of (not illustrated) three deflection units, for example.

If the second aperture unit 109 has a displaceable embodiment, the latter forms the primary particle beam by way of the geometric form of an aperture of the second aperture unit 109. The second aperture unit 109 selects a partial beam of the primary particle beam and aligns the primary particle beam therewith. As a result, the second aperture unit 109 is able to tilt the primary particle beam, but only about a virtual position of the electron source 101. Accordingly, the function of the displaceable second aperture unit 109 can be described as forming and aligning the primary particle beam. In a combination of a stationary second aperture unit 109 and a deflection unit, the function can be described analogously as forming and deflecting the primary particle beam.

The objective lens 107 has pole pieces 110, in which a bore is formed. The beam-guiding tube 104 is guided through this bore. Furthermore, a coil 111 is arranged in the pole pieces 110.

An electrostatic retardation device is arranged in a lower region of the beam-guiding tube 104. It has an individual electrode 112 in the form of a termination electrode and a tube electrode 113. The individual electrode 112 is arranged opposite to an object 114. The tube electrode 113 is arranged at one end of the beam-guiding tube 104, which faces the object 114. Together with the beam-guiding tube 104, the tube electrode 113 is at the potential of the anode 103, while the individual electrode 112 and the object 114 are at a lower potential in relation to the potential of the anode 103. In the present case, this is the ground potential of the housing of the specimen chamber 120. In this manner, the electrons of the primary electron beam may be decelerated to a desired energy which is required for examining the object 114.

A first electric field dominates between the tube electrode 113 and the individual electrode 112. If the individual electrode 112 and the object 114 lie at different potentials (not illustrated in FIG. 1), a second electric field dominates between the individual electrode 112 and the object 114.

The SEM 100 further may comprise a scanning device 115, by means of which the primary electron beam may be deflected and scanned over the object 114. Here, the electrons of the primary electron beam interact with the object 114. As a result of the interaction, interaction particles are generated, which are detected. In particular, electrons are emitted from the surface of the object 114—the so-called secondary electrons—or electrons of the primary electron beam are scattered back—the so-called backscattered electrons—as interaction particles.

The object 114 and the individual electrode 112 may also be at different potentials that deviate from ground, as already mentioned above. It is thereby possible to set the location of the retardation of the primary electron beam in relation to the object 114. By way of example, if the retardation is carried out very near to the object 114, optical aberrations become smaller.

A detector arrangement comprising a first detector 116 and a second detector 117 is arranged in the beam-guiding tube 104 for detecting the secondary electrons and/or the backscattered electrons. Here, the first detector 116 is arranged on the source-side along the optical axis OA, while the second detector 117 is arranged on the object-side along the optical axis OA in the beam-guiding tube 104. The first detector 116 and the second detector 117 are arranged offset from one another in the direction of the optical axis OA of the SEM 100. Both the first detector 116 and the second detector 117 each have a passage opening, through which the primary electron beam may pass. The first detector 116 and the second detector 117 are approximately at the potential of the anode 103 and of the beam-guiding tube 104. The optical axis OA of the SEM 100 extends through the respective passage openings.

The second detector 117 may serve principally for detecting secondary electrons. Upon emerging from the object 114, the secondary electrons initially have a low kinetic energy and arbitrary directions of motion. By means of the strong extraction field emanating from the tube electrode 113, the secondary electrons are accelerated in the direction of the objective lens 107. The secondary electrons enter the objective lens 107 approximately parallel. The beam diameter of the beam of secondary electrons also remains small in the objective lens 107. The objective lens 107 then has a strong effect on the secondary electrons and produces a comparatively short focus of the secondary electrons with sufficiently steep angles with respect to the optical axis OA, such that the secondary electrons diverge far apart from one another downstream of the focus and impinge on the second detector 117 on the active area thereof. By contrast, only a small proportion of electrons that are backscattered at the object 114, i.e., backscattered electrons which have a relatively high kinetic energy in comparison with the secondary electrons upon emerging from the object 114, are captured by the second detector 117. The high kinetic energy and the angles of the backscattered electrons with respect to the optical axis OA upon emerging from the object 114 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially may serve to detect the backscattered electrons.

In a further embodiment of the SEM 100, the first detector 116 may additionally be embodied with an opposing field grid 116A. The opposing field grid 116A is arranged at the side of the first detector 116 directed toward the object 114. With respect to the potential of the beam-guiding tube 104, the opposing field grid 116A has a negative potential such that only backscattered electrons with a high energy pass through the opposing field grid 116A to the first detector 116. Additionally or alternatively, the second detector 117 has a further opposing field grid, which has an analogous embodiment to the aforementioned opposing field grid 116A of the first detector 116 and which has an analogous function.

The detector signals produced by the first detector 116 and the second detector 117 are used to generate an image or images of the surface of the object 114.

Reference is explicitly made to the fact that the apertures of the first aperture unit 108 and of the second aperture unit 109, as well as the passage openings of the first detector 116 and of the second detector 117 are depicted in exaggerated fashion. The passage openings of the first detector 116 and of the second detector 117 have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 is configured as a pinhole aperture in the illustrative embodiment depicted here and provided with a second aperture 118 for the passage of the primary electron beam, which has an extent in the range from 5 µm to 500 µm, e.g. 35 µm. As an alternative thereto, provision is made in a further illustrative embodiment for the second aperture unit 109 to be provided with a plurality of apertures, which can be displaced mechanically with respect to the primary electron beam or which can be reached by the primary electron beam by the use of electrical and/or magnetic deflection elements. Reference is made to the explanations provided above in respect of the second aperture unit 109. The second aperture unit 109 is embodied as a pressure stage aperture. It separates a first region, in which the electron source 101 is arranged and in which an ultra-high vacuum ($10^{-7}$ hPa to $10^{-12}$ hPa) prevails, from a second region, which has a high vacuum ($10^{-3}$ hPa to $10^{-7}$ hPa). The second region is the intermediate pressure region of the beam-guiding tube 104, which leads to the specimen chamber 120.

The specimen chamber 120 is under vacuum. For the purposes of generating the vacuum, a pump (not illustrated) is arranged at the specimen chamber 120. In the illustrative embodiment illustrated in FIG. 1, the specimen chamber 120 is operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the specimen chamber 120 is vacuum-sealed.

The object 114 is arranged at a specimen stage 122. The specimen stage 122 is embodied to be movable in three directions arranged perpendicular to one another, namely in an x-direction, in a y-direction and in a z-direction. Moreover, the specimen stage 122 can be rotated about two rotational axes which are arranged perpendicular to one another.

The SEM 100 further may comprise a third detector 121, which is arranged in the specimen chamber 120. More precisely, the third detector 121 is arranged behind the object 114, as seen from the electron source 101 along the optical axis OA. The primary electron beam passes through the object 114 to be examined. When the primary electron beam passes through the object 114 to be examined, the electrons of the primary electron beam interact with the material of the object 114 to be examined. The electrons passing through the object 114 to be examined are detected by the third detector 121.

The SEM 100 further may comprise a fourth detector, namely a chamber detector 134, which is arranged in the specimen chamber 120.

The first detector 116, the second detector 117, the third detector 121 and the chamber detector 134 are connected to a monitoring unit 123, which has a monitor 124. The monitoring unit 123 processes detector signals that are generated by the first detector 116, the second detector 117, the third detector 121 and/or the chamber detector 134 and displays on the monitor 124 said detector signals in the form of images. Moreover, the monitoring unit 123 may comprise a processor 130, loaded onto which there is a computer program product with program code which controls the SEM 100 in such a way that a method according to an embodiment of the system described herein is carried out. This will still be explained in more detail below.

The coil 111 of the objective lens 107 is line-connected to an objective lens control unit 125. The objective lens control unit 125 is used to set the objective lens current that is supplied to the coil 111. As a result of this, it is possible to influence and set a magnetic field that is generated by the objective lens 107. In one embodiment, the coil 111 can have two partial coils. These each have a dedicated current supply in the objective lens control unit 125. By way of example, this obtains a variable magnetic field with a constant power loss in the partial coils.

The beam generator is line-connected to a beam generator control unit in the form of an electron source control unit 126. The electron source 101, the suppressor electrode 101A and the extraction electrode 102 are connected to the electron source control unit 126 and are supplied with voltage by the electron source control unit 126.

The first deflection unit 131 and the second deflection unit 132 are connected to a deflection control unit 133 and supplied with voltages and/or currents via the deflection control unit 133.

Figure 2:
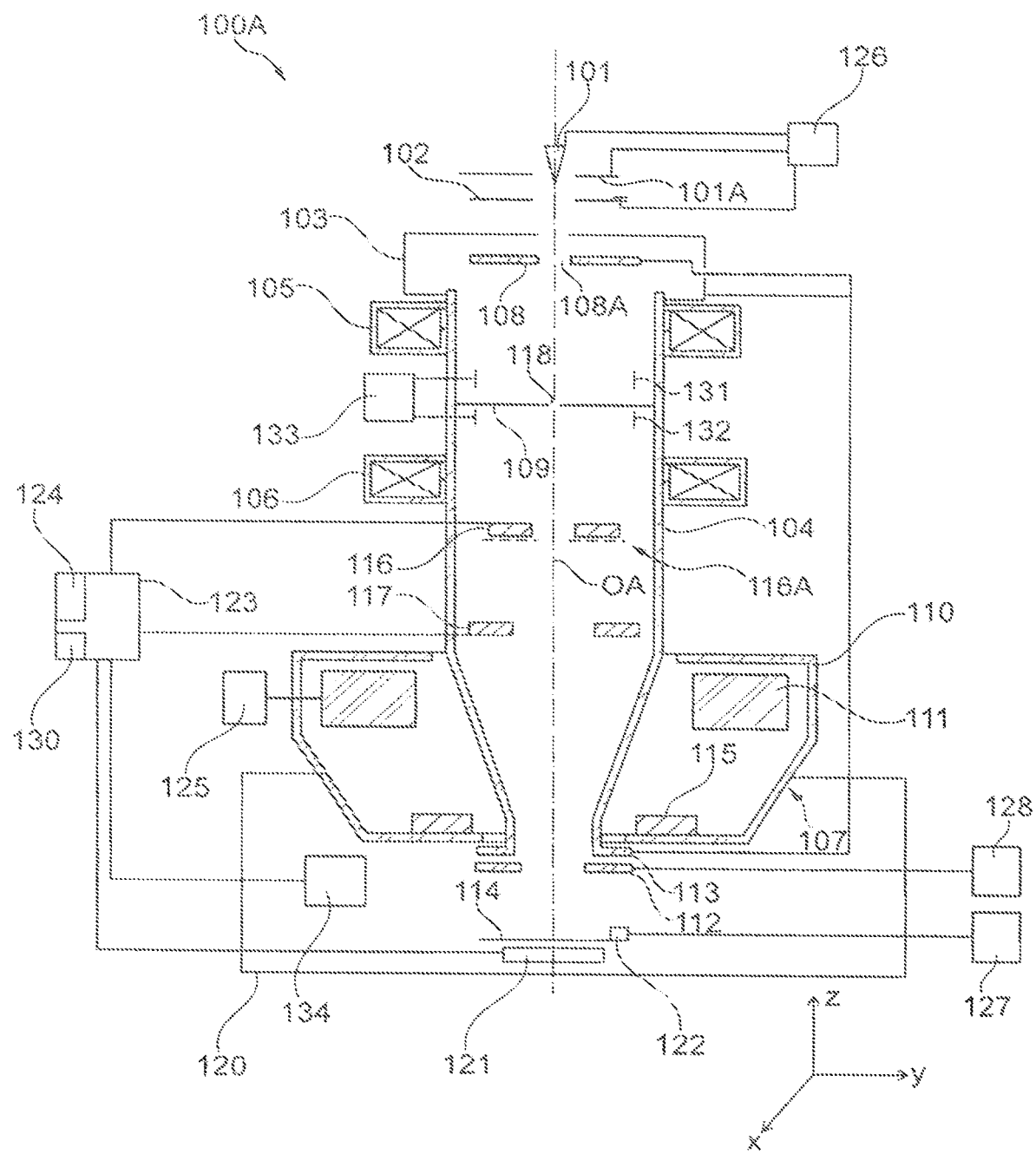
FIG. 2 shows a schematic illustration of a second illustrative embodiment of a particle beam apparatus.

FIG. 2 shows a schematic illustration of a further SEM 100A. The SEM 100A according to FIG. 2 is based on the SEM 100 according to FIG. 1. Identical component parts are provided with identical reference signs. Therefore, reference is initially made to the explanations above. However, in contrast to the illustrative embodiment of FIG. 1, the illustrative embodiment of FIG. 2 additionally has an object voltage control unit 127 for supplying the object 114 with object voltage. The object voltage supplied to the object 114 is set by means of the object voltage control unit 127. Moreover, the SEM 100A additionally or alternatively has a termination electrode control unit 128, which likewise supplies the individual electrode 112 with a termination electrode voltage. The termination electrode voltage, which is supplied to the individual electrode 112, is set by means of the termination electrode control unit 128.

Figure 3:
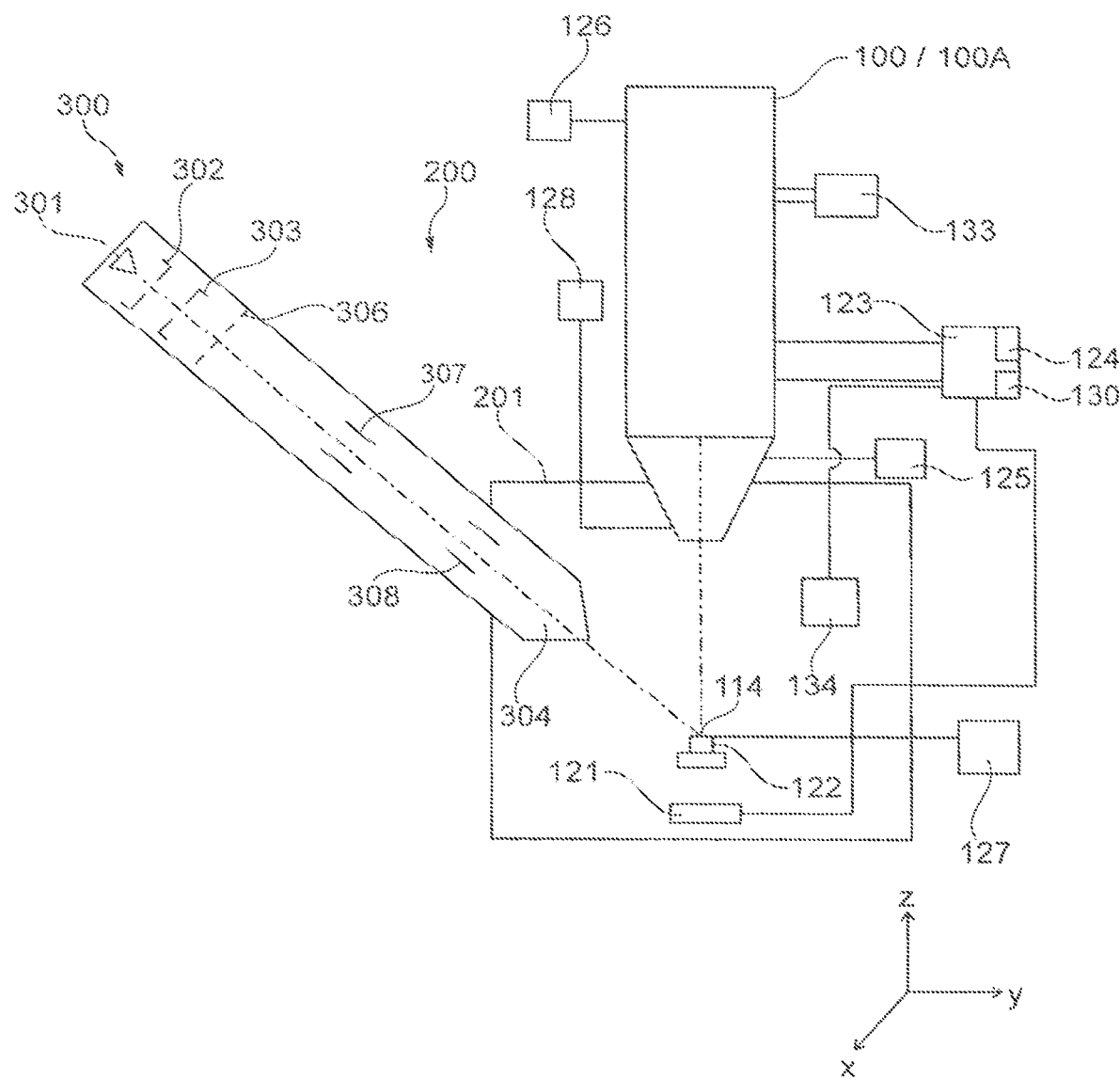
FIG. 3 shows a schematic illustration of a third illustrative embodiment of a particle beam apparatus.

FIG. 3 shows a particle beam apparatus in the form of a combination apparatus 200. The combination apparatus 200 has two particle beam columns. Firstly, the combination apparatus 200 is provided with the SEM 100 of FIG. 1 or with the SEM 100A of FIG. 2, albeit without the specimen chamber 120. Rather, the SEM 100 or SEM 100A is arranged at a specimen chamber 201. The specimen chamber 201 is under vacuum. For the purposes of generating the vacuum, a pump (not illustrated) is arranged at the specimen chamber 201. In the illustrative embodiment illustrated in FIG. 3, the specimen chamber 201 is operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the specimen chamber 201 is vacuum-sealed.

The SEM 100 or the SEM 100A may serve to generate a first particle beam, namely the primary electron beam already described further above. The SEM 100 and the SEM 100A have been explained in detail with respect to FIGS. 1 and 2. Reference is made to these explanations. They also apply to the illustrative embodiment of FIG. 3. Components that are not illustrated in FIG. 3 are illustrated in FIGS. 1 and 2. In addition to the SEM 100 or the SEM 100A, the combination apparatus 200 is provided with an ion beam apparatus 300, which is likewise arranged at the specimen chamber 201.

The SEM 100 or the SEM 100A is arranged vertically in relation to the specimen chamber 201. By contrast, the ion beam apparatus 300 is arranged inclined by an angle of approximately 50° in relation to the SEM 100 or the SEM 100A. It has a second beam generator in the form of an ion beam generator 301. Ions, which form a second particle beam in the form of an ion beam, are generated by the ion beam generator 301. The ions are accelerated by means of an extraction electrode 302, which is at a predeterminable potential. The second particle beam then passes through ion optics of the ion beam apparatus 300, wherein the ion optics comprise a condenser lens 303 and a further objective lens 304. The further objective lens 304 ultimately may generate an ion probe, which is focused onto the object 114 arranged at a specimen stage 122.

An adjustable aperture 306, a first electrode arrangement 307 and a second electrode arrangement 308 are arranged above the further objective lens 304 (i.e. in the direction of the ion beam generator 301), wherein the first electrode arrangement 307 and the second electrode arrangement 308 are embodied as scanning electrodes. The second particle beam is scanned over the surface of the object 114 by means of the first electrode arrangement 307 and the second electrode arrangement 308, with the first electrode arrangement 307 acting in a first direction and the second electrode arrangement 308 acting in a second direction, which is counter to the first direction. Using this, scanning is carried out in e.g. an x-direction. The scanning in a y-direction perpendicular thereto is brought about by further electrodes (not depicted), which are rotated by 90°, at the first electrode arrangement 307 and at the second electrode arrangement 308.

As discussed above, the object 114 is arranged at the specimen stage 122. In the illustrative embodiment shown in FIG. 3, the specimen stage 122 is also embodied to be movable in three directions arranged perpendicular to one another, namely in an x-direction, in a y-direction and in a z-direction. Moreover, the specimen stage 122 can be rotated about two rotational axes which are arranged perpendicular to one another.

The distances depicted in FIG. 3 between the individual units of the combination apparatus 200 are depicted in exaggerated fashion in order to better illustrate the individual units of the combination apparatus 200.

As already explained above, the SEM 100 or the SEM 100A has a monitoring unit 123, which is provided with a monitor 124. The monitoring unit 123 processes detector signals that are generated by the first detector 116, the second detector 117, the third detector 121 and/or the chamber detector 134 and displays on the monitor 124 said detector signals in the form of images. Moreover, the monitoring unit 123 may comprise a processor 130, loaded onto which there is a computer program product with program code which controls the SEM 100 or the SEM 100A in such a way that a method according to an embodiment of the system described herein is carried out. This will still be explained in more detail below.

The coil 111 of the objective lens 107 of the SEM 100 or of the SEM 100A is connected to the objective lens control unit 125. The objective lens control unit 125 is used to set the objective lens current that is supplied to the coil 111. As a result of this, it is possible to influence and set a magnetic field that is generated by the objective lens 107.

Further, a first electric field dominates between the tube electrode 113 and the individual electrode 112. By contrast, a second electric field dominates between the individual electrode 112 and the object 114.

The beam generator of the SEM 100 of the SEM 100A is line-connected to the beam generator control unit in the form of the electron source control unit 126. The electron source 101, the suppressor electrode 101A and the extraction electrode 102 are connected to the electron source control unit 126 and are supplied with voltage and/or current by the electron source control unit 126.

If the SEM 100A is used in the illustrative embodiment of FIG. 3, the SEM 100A has the object voltage control unit 127 for supplying the object voltage to the object 114. The object voltage supplied to the object 114 is set by means of the object voltage control unit 127. Moreover, the SEM 100A additionally or alternatively has the termination electrode control unit 128, which supplies the individual electrode 112 with the termination electrode voltage. The termination electrode voltage, which is supplied to the individual electrode 112, is set by means of the termination electrode control unit 128.

Here, too, the first deflection unit 131 and the second deflection unit 132 are line-connected to a deflection control unit 133 and supplied with voltages and/or currents via the deflection control unit 133.

Figure 4:
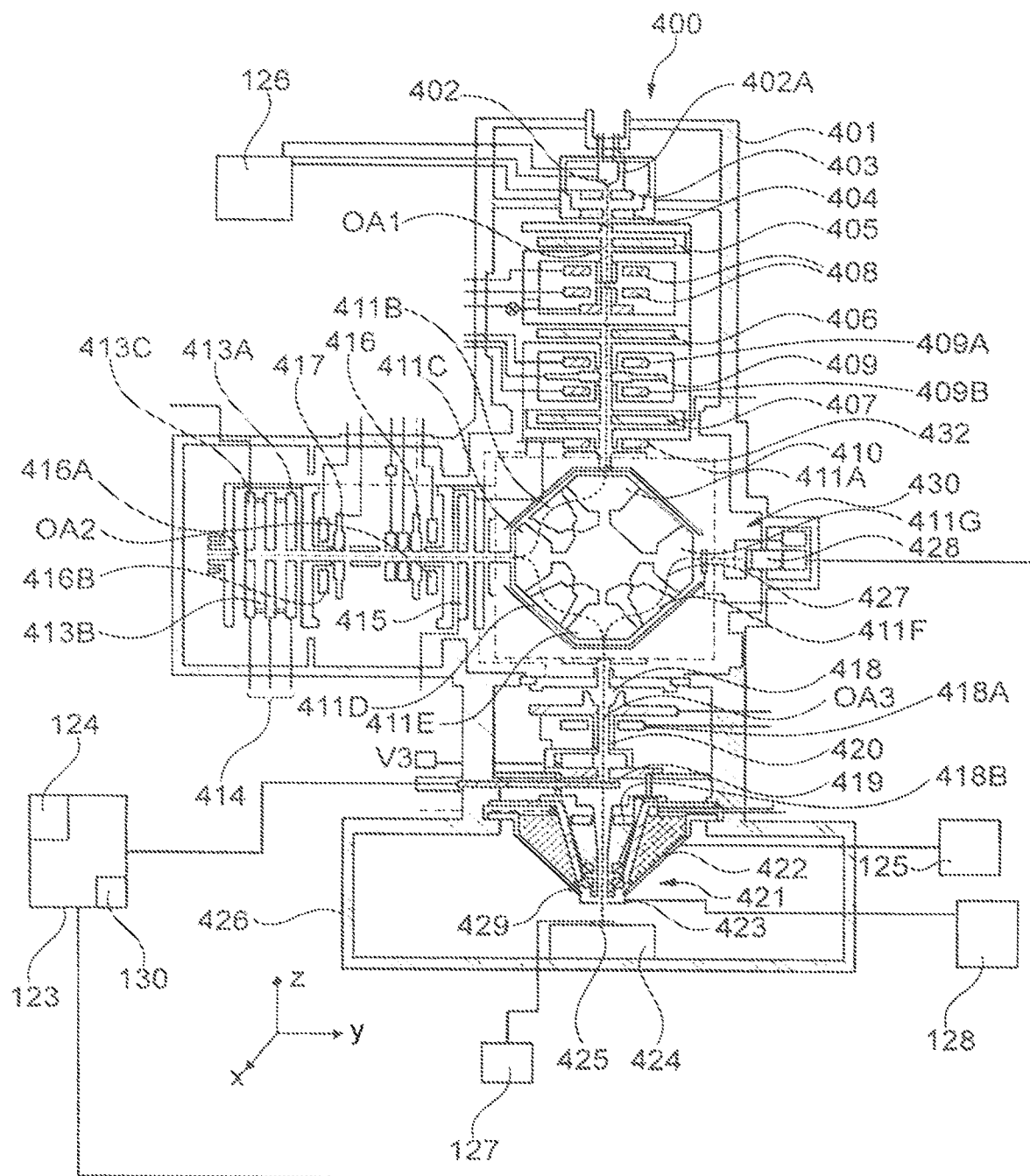
FIG. 4 shows a schematic illustration of a fourth illustrative embodiment of a particle beam apparatus.

FIG. 4 is a schematic illustration of a further illustrative embodiment of a particle beam apparatus for the system described herein. This illustrative embodiment of the particle beam apparatus is provided with the reference sign 400 and said illustrative embodiment may comprise a mirror corrector for correcting e.g. chromatic and/or spherical aberrations. The particle beam apparatus 400 may comprise a particle beam column 401, which is embodied as an electron beam column and which substantially corresponds to an electron beam column of a corrected SEM. However, the particle beam apparatus 400 is not restricted to an SEM with a mirror corrector. Rather, the particle beam apparatus may comprise any type of corrector unit.

The particle beam column 401 may comprise a particle beam generator in the form of an electron source 402 (cathode), a suppressor electrode 402A, an extraction electrode 403, and an anode 404. By way of example, the electron source 402 is embodied as a thermal field emitter. Electrons emerging from the electron source 402 are accelerated to the anode 404 due to a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is adjusted along the beam path using a beam-guiding device. The beam-guiding device of this illustrative embodiment may comprise a source adjustment unit with two magnetic deflection units 408 arranged along the first optical axis OA1. Moreover, the particle beam apparatus 400 may comprise electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 may comprise a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and said particle beam is deflected by the beam deflection device 410 in the direction of a second optical axis OA2. The beam deflection is performed by means of the first magnetic sector 411A, by means of the second magnetic sector 411B and by means of the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the illustrative embodiment in FIG. 4, the deflection with respect to the second optical axis OA2 and with respect to the third optical axis OA3 is provided by deflecting the particle beam at an angle of 90°. Hence, the third optical axis OA3 extends coaxially with respect to the first optical axis OA1. However, reference is made to the fact that the particle beam apparatus 400 according to an embodiment of the system described herein described here is not restricted to deflection angles of 90°. Rather, any suitable deflection angle may be selected by the beam deflection device 410, for example 70° or 110°, such that the first optical axis OA1 does not extend coaxially with respect to the third optical axis OA3. In respect of further details of the beam deflection device 410, reference is made to WO 2002/067286 A2.

After the particle beam was deflected by the first magnetic sector 411A, the second magnetic sector 411B, and the third magnetic sector 411C, the particle beam is guided along the second optical axis OA2. The particle beam is guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, they are deflected to the third optical axis OA3 by the third magnetic sector 411C, the fourth magnetic sector 411D, and the fifth magnetic sector 411E.

The electrons of the particle beam emerge from the beam deflection device 410 and are guided along the third optical axis OA3 to the object 425 which is intended to be examined. On the path to the object 425, the particle beam is guided to a fifth electrostatic lens 418, a beam-guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam-guiding tube 420.

By means of the objective lens 421, the particle beam is focused into a focal plane in which the object 425 is arranged. The object 425 is arranged at a movable specimen stage 424. The movable specimen stage 424 is arranged in a specimen chamber 426 of the particle beam apparatus 400. The specimen stage 424 is embodied to be movable in three directions arranged perpendicular to one another, namely in an x-direction, in a y-direction and in a z-direction. Moreover, the specimen stage 424 can be rotated about two rotational axes which are arranged perpendicular to one another. The specimen chamber 426 is under vacuum. For the purposes of generating the vacuum, a pump (not illustrated) is arranged at the specimen chamber 426. In the illustrative embodiment illustrated in FIG. 4, the specimen chamber 426 is operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the specimen chamber 426 is vacuum-sealed.

The objective lens 421 may be embodied as a combination of a magnetic lens 422 and a sixth electrostatic lens 423 in the form of a termination electrode. The end of the beam-guiding tube 420 further may be an electrode of an electrostatic lens. After emerging from the beam guiding tube 420, particles of the particle beam apparatus 400 are decelerated to a potential of the object 425 arranged on the sample stage 424. The objective lens 421 is not restricted to a combination of the magnetic lens 422 and the sixth electrostatic lens 423. Rather, the objective lens 421 may assume any suitable form. By way of example, the objective lens 421 also may be embodied as a purely magnetic lens or as a purely electrostatic lens.

The particle beam which is focused onto the object 425 interacts with the object 425. Interaction particles are generated. In particular, secondary electrons are emitted from the object 425 or backscattered electrons are scattered back at the object 425. The secondary electrons or the backscattered electrons are accelerated again and guided into the beam-guiding tube 420 along the third optical axis OA3. In particular, the trajectories of the secondary electrons and the backscattered electrons extend on the route of the beam path of the particle beam in the opposite direction to the particle beam.

The particle beam apparatus 400 may comprise a first analysis detector 419 which is arranged between the beam deflection device 410 and the objective lens 421 along the beam path. Secondary electrons traveling in directions oriented at a large angle with respect to the third optical axis OA3 are detected by the first analysis detector 419. Backscattered electrons and secondary electrons which have a small axial distance with respect to the third optical axis OA3 at the location of the first analysis detector 419—i.e. backscattered electrons and secondary electrons which have a small distance from the third optical axis OA3 at the location of the first analysis detector 419—enter the beam deflection device 410 and are deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 may generate detector signals which are largely generated by emitted secondary electrons. The detector signals which are generated by the first analysis detector 419 are guided to a monitoring unit 123 and used to obtain information about the properties of the interaction region of the focused particle beam with the object 425. In particular, the focused particle beam is scanned over the object 425 using a scanning device 429. Then, an image of the scanned region of the object 425 can be generated by the detector signals, which are generated by the first analysis detector 419, and it can be displayed on a display unit. The display unit is for example a monitor 124 that is arranged at the monitoring unit 123.

The second analysis detector 428 is also connected to the monitoring unit 123. Detector signals of the second analysis detector 428 are supplied to the monitoring unit 123 and used to generate an image of the scanned region of the object 425 and to display it on a display unit. The display unit is for example the monitor 124 that is arranged at the monitoring unit 123.

Moreover, the monitoring unit 123 may comprise a processor 130, loaded onto which there is a computer program product with program code which controls the particle beam apparatus 400 in such a way that a method according to an embodiment of the system described herein is carried out. This will still be explained in more detail below.

The coil of the objective lens 421 is line-connected to an objective lens control unit 125. The objective lens control unit 125 is used to set the objective lens current that is supplied to the coil. As a result of this, it is possible to influence and set a magnetic field that is generated by the objective lens 421.

Further, a first electric field dominates between the end of the beam-guiding tube 420 and the sixth electrostatic lens 423. By contrast, a second electric field dominates between the sixth electrostatic lens 423 and the object 425.

The electron source 402, the suppressor electrode 402A and the extraction electrode 403 are connected to an electron source control unit 126 and are supplied with voltage and/or current by the electron source control unit 126.

Additionally, an object voltage control unit 127 is provided for supplying the object 425 with object voltage. The object voltage supplied to the object 425 is set by means of the object voltage control unit 127. Moreover, the particle beam apparatus 400 additionally or alternatively has a termination electrode control unit 128, which supplies the sixth electrostatic lens 423 in the form of the termination electrode with a termination electrode voltage. The termination electrode voltage, which is supplied to the sixth electrostatic lens 423, is set by means of the termination electrode control unit 128.

Figure 5:
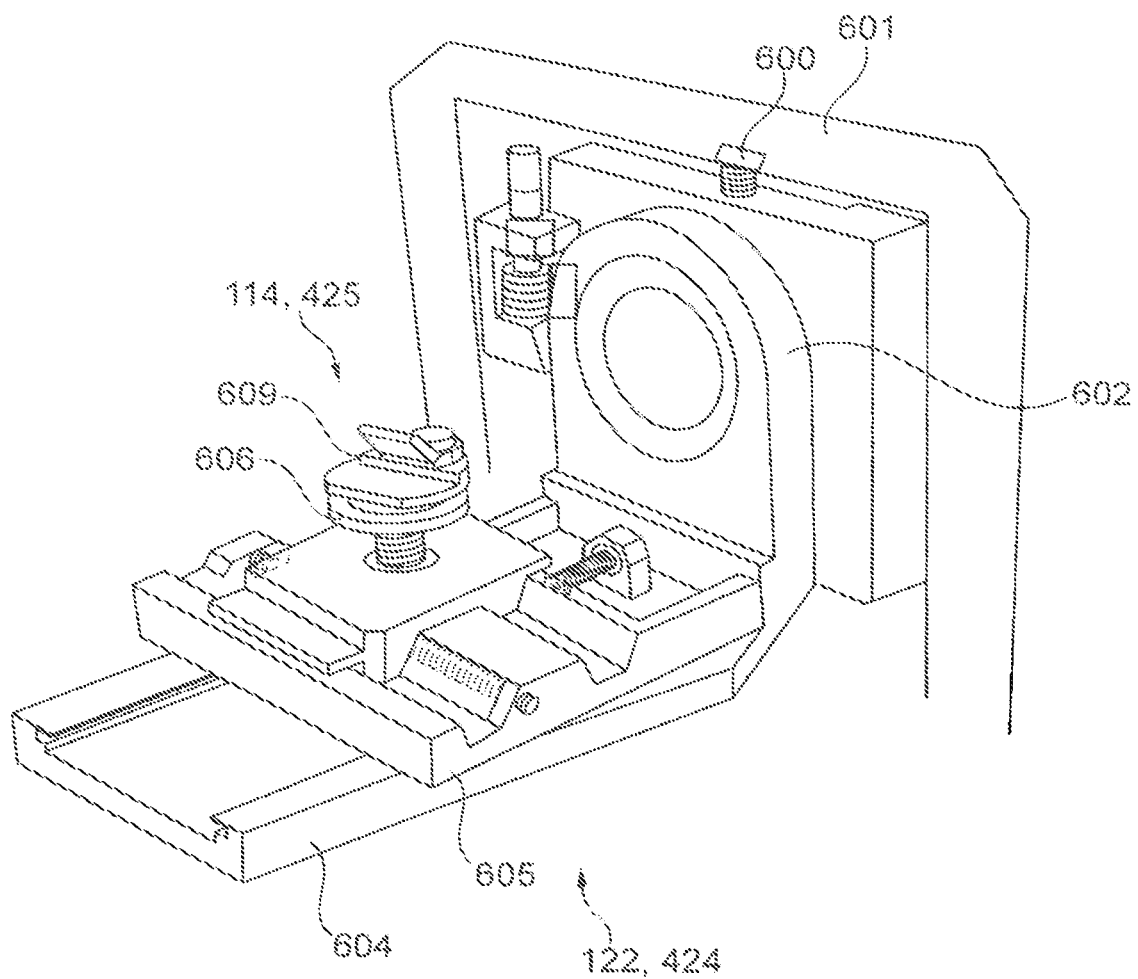
FIG. 5 shows a schematic illustration of an illustrative embodiment of a specimen stage.

Now, the specimen stage 122, 424 of the particle beam apparatuses 100, 100A, 200 and 400 explained above is discussed in more detail below. The specimen stage 122, 424 is embodied as a movable specimen stage, which is illustrated schematically in FIGS. 5 and 6. Reference is made to the fact that the system described herein is not restricted to the specimen stage 122, 424 described here. Rather, the system described herein can have any movable specimen stage that is suitable for the system described herein.

The object 114, 425 is arranged on the specimen stage 122, 424. The specimen stage 122, 424 has movement elements that ensure a movement of the specimen stage 122, 424 in such a way that a region of interest on the object 114, 425 can be examined by means of a particle beam. The movement elements are illustrated schematically in FIGS. 5 and 6 and are explained below.

The specimen stage 122, 424 has a first movement element 600 at a housing 601 of the specimen chamber 120, 201 or 426, in which the specimen stage 122, 424 is arranged.

The first movement element 600 facilitates a movement of the specimen stage 122, 424 along the z-axis (third stage axis). Further, provision is made of a second movement element 602. The second movement element 602 facilitates a rotation of the specimen stage 122, 424 about a first stage rotation axis 603, which is also referred to as a tilt axis. This second movement element 602 may serve to tilt the object 114, 425 about the first stage rotation axis 603.

Arranged at the second movement element 602, in turn, is a third movement element 604 that is embodied as a guide for a carriage and that ensures that the specimen stage 122, 424 is movable in the x-direction (first stage axis). The aforementioned carriage is a further movement element in turn, namely a fourth movement element 605. The fourth movement element 605 is embodied in such a way that the specimen stage 122, 424 is movable in the y-direction (second stage axis). To this end, the fourth movement element 605 has a guide in which a further carriage is guided, a holder 609 with the object 114, 425 in turn being arranged at the latter.

The holder 609 is embodied, in turn, with a fifth movement element 606 that facilitates a rotation of the holder 609 about a second stage rotation axis 607. The second stage rotation axis 607 is oriented perpendicular to the first stage rotation axis 603.

On account of the above-described arrangement, the specimen stage 122, 424 of the illustrative embodiment discussed here has the following kinematic chain: first movement element 600 (movement along the z-axis)—second movement element 602 (rotation about the first stage rotation axis 603)—third movement element 604 (movement along the x-axis)—fourth movement element 605 (movement along the y-axis)—fifth movement element 606 (rotation about the second stage rotation axis 607).

In a further illustrative embodiment (not illustrated), provision is made for further movement elements to be arranged at the specimen stage 122, 424 such that movements along further translational axes and/or about further rotational axes are facilitated.

Figure 6:
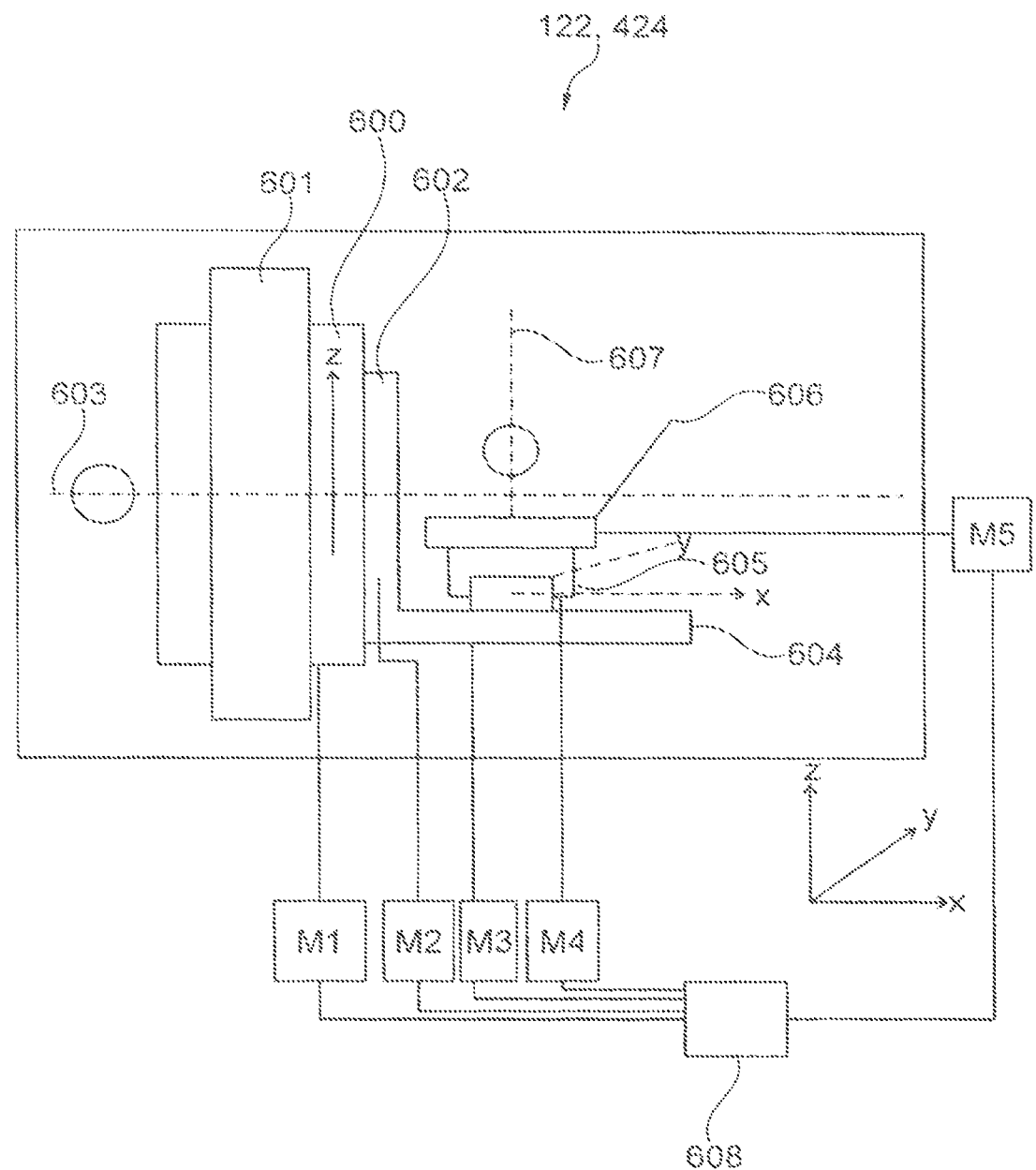
FIG. 6 shows a further schematic illustration of the specimen stage according to FIG. 5.

It is clear from FIG. 6 that each of the aforementioned movement elements is connected to a stepper motor. Thus, the first movement element 600 is connected to a first stepper motor M1 and the former is driven on account of a driving force that is provided by the first stepper motor M1. The second movement element 602 is connected to a second stepper motor M2, which drives the second movement element 602. The third movement element 604 is connected, in turn, to a third stepper motor M3. The third stepper motor M3 provides a driving force for driving the third movement element 604. The fourth movement element 605 is connected to a fourth stepper motor M4, wherein the fourth stepper motor M4 drives the fourth movement element 605. Further, the fifth movement element 606 is connected to a fifth stepper motor M5. The fifth stepper motor M5 provides a driving force that drives the fifth movement element 606. The aforementioned stepper motors M1 to M5 are controlled by a control unit 608 (see FIG. 6).

Figure 7:
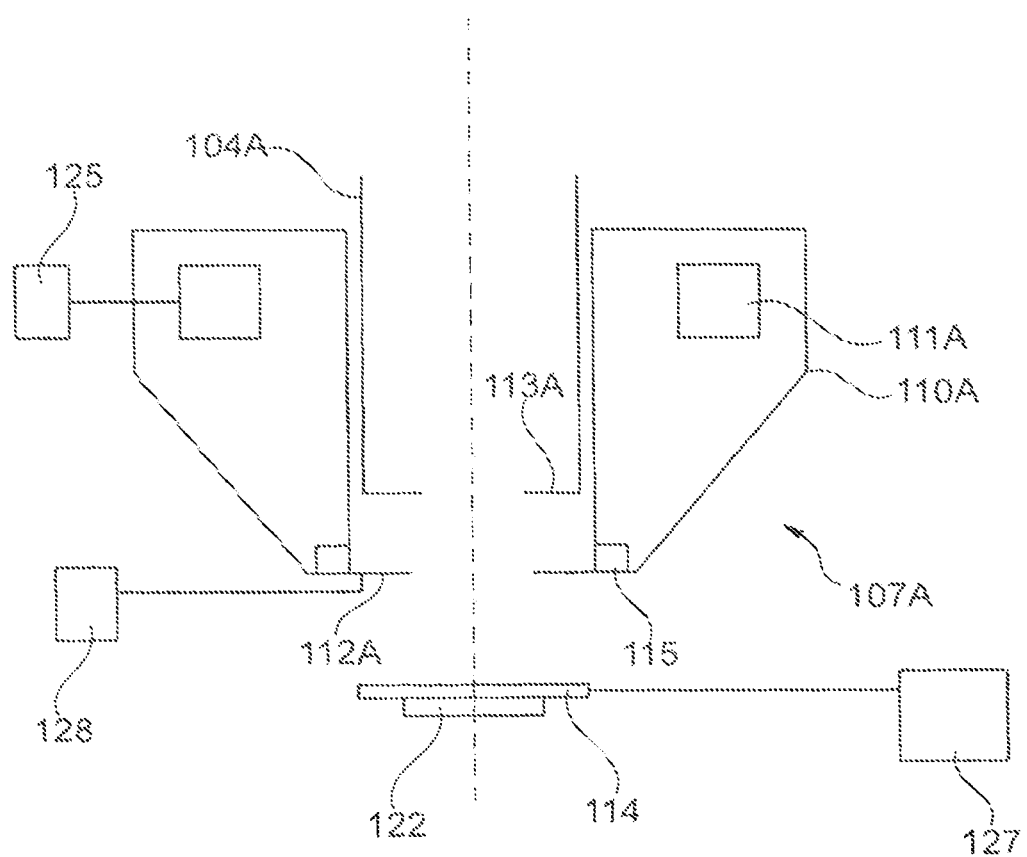
FIG. 7 shows a schematic illustration of an illustrative embodiment of an objective lens.

FIG. 7 shows a further illustrative embodiment of an objective lens 107A. The objective lens 107A is based on the objective lens 107 according to FIGS. 1 and 2 and can be used, for example, in the SEM 100 according to FIG. 1, in the SEM 100A according to FIG. 2 and/or in the combination apparatus 200 according to FIG. 3. The objective lens 107A has pole pieces 110A, in which a bore is formed. A beam-guiding tube 104A is guided through this bore. Furthermore, a coil 111A is arranged in the pole pieces 110A. An electrostatic retardation device is arranged in a lower region of the beam-guiding tube 104A. The electrostatic retardation device has an individual electrode 112A in the form of a termination electrode and a tube electrode 113A, which is arranged within the pole pieces 110A. The individual electrode 112A is arranged opposite to the object 114. The tube electrode 113A is arranged at one end of the beam-guiding tube 104A, which faces the object 114. Together with the beam-guiding tube 104A, the tube electrode 113A is at the potential of the anode 103, while the individual electrode 112A and the object 114 are at a lower potential in relation to the potential of the anode 103. In this manner, the electrons of the primary electron beam may be decelerated to a desired energy which is required for examining the object 114.

The objective lens 107A firstly may generate a magnetic field. Secondly, there are two electric fields, namely a first electric field between the individual electrode 112A and the tube electrode 113, and a second electric field between the individual electrode 112A and the object 114. The individual electrode 112A is aligned parallel to the tube electrode 113A.

The coil 111A of the objective lens 107A is line-connected to the objective lens control unit 125. The objective lens control unit 125 is used to set the objective lens current that is supplied to the coil 111A. As result of this, it is possible to influence and set the magnetic field that is generated by the objective lens 107A. Moreover, provision is additionally or alternatively made, for example, for the individual electrode 112A to be line-connected to the termination electrode control unit 128, which supplies the individual electrode 112A with a termination electrode voltage. The termination electrode voltage, which is supplied to the individual electrode 112A, is set by means of the termination electrode control unit 128. In addition or as an alternative thereto, provision is made for the object 114 to be line connected to the object voltage control unit 127 for supplying the object 114 with object voltage. The object voltage supplied to the object 114 is set by means of the object voltage control unit 127.

Figure 8:
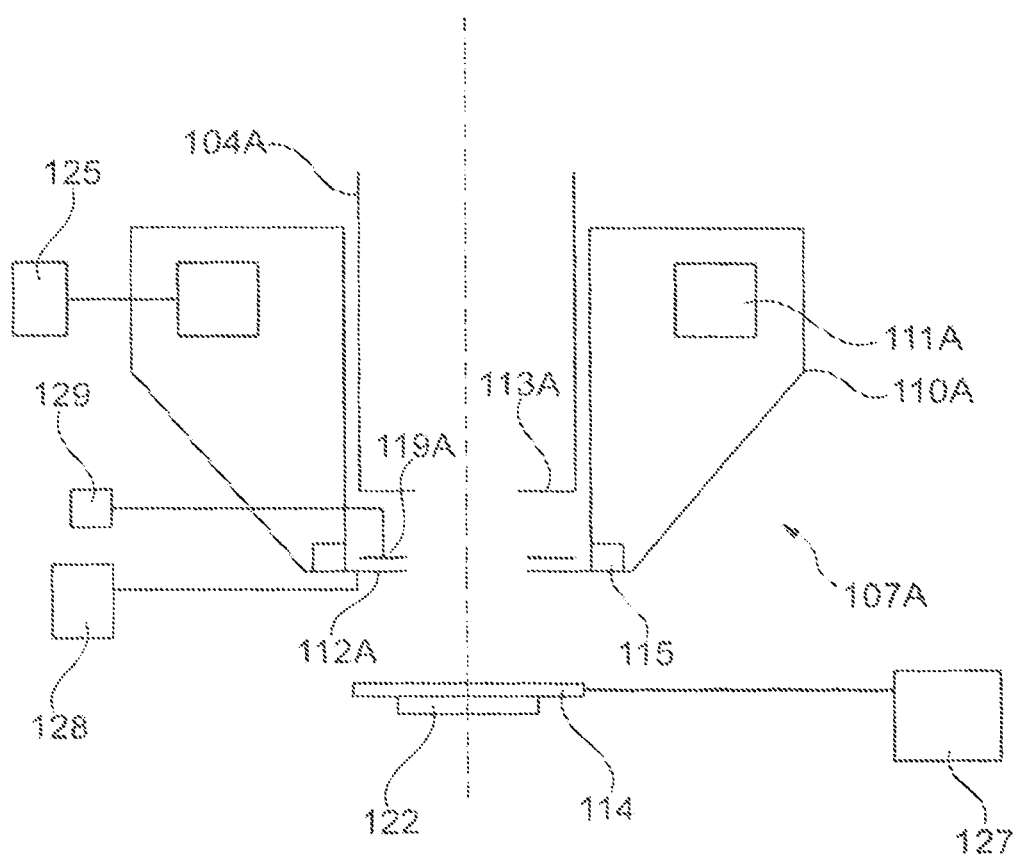
FIG. 8 shows a schematic illustration of a further illustrative embodiment of an objective lens.

FIG. 8 shows a schematic illustration of a further illustrative embodiment of the objective lens 107A. The objective lens 107A according to FIG. 8 is based on the objective lens 107A according to FIG. 7. Identical component parts are provided with identical reference signs. Therefore, reference is initially made to the explanations above. However, in contrast to the illustrative embodiment of FIG. 7, the illustrative embodiment of FIG. 8 additionally has an electrode 119A, which is arranged between the tube electrode 113A and the individual electrode 112A. In this illustrative embodiment, the individual electrode 112A is a first termination electrode, while the electrode 119A is a second termination electrode. Consequently, the termination electrode control unit 128 is a first termination electrode control unit, which supplies a first termination electrode voltage to the individual electrode 112A. The first termination electrode voltage is set by means of the termination electrode control unit 128. Further, provision is made for the electrode 119A to be line-connected to a second termination electrode control unit 129, which supplies a second termination electrode voltage to the electrode 119A. The second termination electrode voltage is set by means of the second termination electrode control unit 129.

Figure 9:
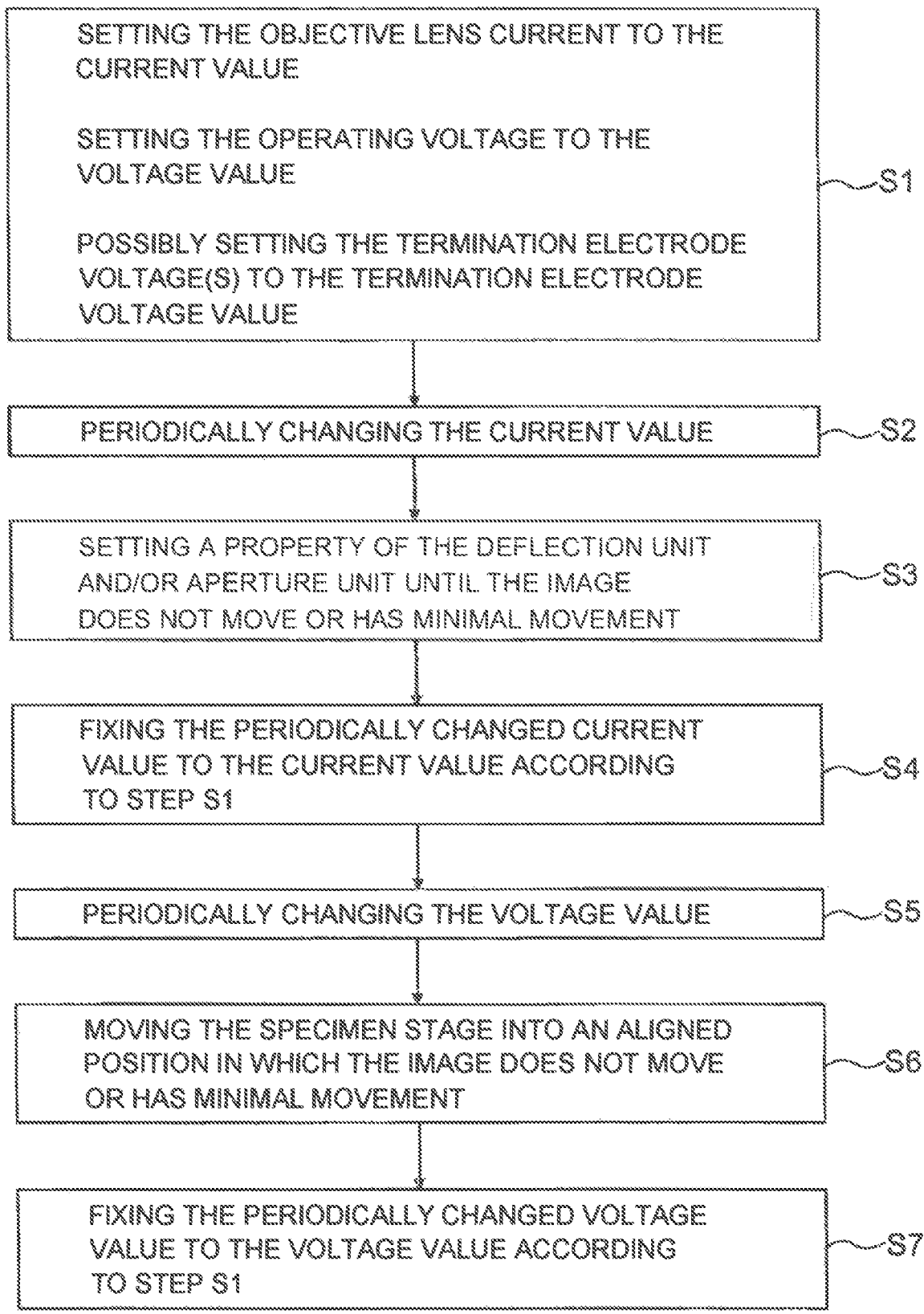
FIG. 9 shows a schematic illustration of a flowchart of a method according to an embodiment of the system described herein.

FIG. 9 shows an illustrative embodiment of a first method for the system described herein, which is implemented, for example, with the SEM 100 according to FIG. 1, with the SEM 100A according to FIG. 2, with the combination apparatus 200 according to FIG. 3 and/or with the particle beam apparatus 400 according to FIG. 4. Carrying out the first method according to an embodiment of the system described herein with the SEM 100 according to FIG. 1 or the SEM 100A according to FIG. 2 is described below. Analogous statements apply in respect of carrying out the first method according to an embodiment of the system described herein with the particle beam apparatuses specified further above.

Figure 10:
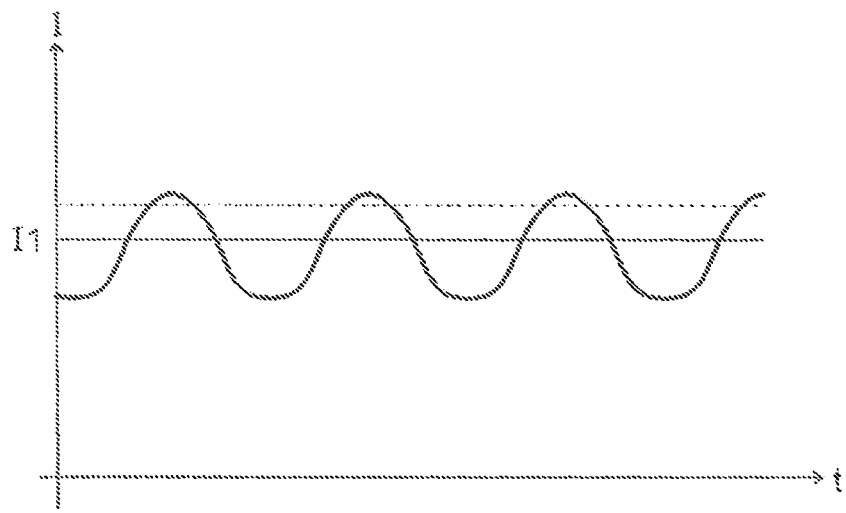
FIG. 10 shows a schematic illustration of a periodic change in an objective lens current.

In a method according to an embodiment of the system described herein, the objective lens current of the objective lens 107 is initially swept in method steps S1 to S4. Expressed differently, the objective lens current is initially set to a current value by means of the objective lens control unit 125 (method step S1). Further, the operating voltage in the form of the cathode voltage is set to a voltage value (method step S1). If a method according to an embodiment of the system described herein is carried out with the SEM 100A according to FIG. 2, the termination electrode voltage (s) are also set to a termination electrode voltage value (method step S1). Then, there is a periodic change in the current value of the objective lens current by way of the objective lens control unit 125 (method step S2). This is illustrated in more detail in FIG. 10. FIG. 10 shows a schematic illustration of the objective lens current I as a function of time t. The objective lens current I set to the current value I1 in method step S1 is changed periodically. Here, the period lies, for example, in the range of 0.5 Hz to 3 Hz, in particular in the range from 1 Hz to 2 Hz, with the range boundaries always being included in the aforementioned ranges. By way of example, the maximum amplitude lies in the range from 0.1% to 10% above or below the set objective lens current I1, with the maximum amplitude being the distance between the apex of a maximum of the amplitude and the current value I1. At least one property of the deflection unit and/or of the aperture unit in the form of the second aperture unit 109 is set in method step S3 during the periodic change in the current value I1 of the objective lens current. By way of example, the aforementioned property is a position of the second aperture unit 109 in the SEM 100 or SEM 100A, said position being set. The primary particle beam is formed by setting the position of the second aperture unit 109. In particular, a partial beam of the primary particle beam is selected.

Additionally or alternatively, a property of the first deflection unit 131 and/or the second deflection unit 132 in the form of an actuation variable for the electrostatic and/or magnetic units of the first deflection unit 131 or the second deflection unit 132 is set. By way of example, the actuation variable is a voltage or current. Setting at least one of the aforementioned properties is implemented in such a way that either the image of the object 114 displayed on the display device in the form of the monitor 124 does not move or any such movement of the displayed image has a minimal deflection. By way of example, the deflection from a predeterminable zero on the monitor 124 is determined. Expressed differently, setting at least one of the aforementioned properties is implemented until either the image of the object 114 displayed on the monitor 124 does not move or any such movement of the displayed image has a minimal deflection (method step S3). Subsequently, the periodically changed current value is fixed to the current value of method step S1 in method step S4.

Figure 11:
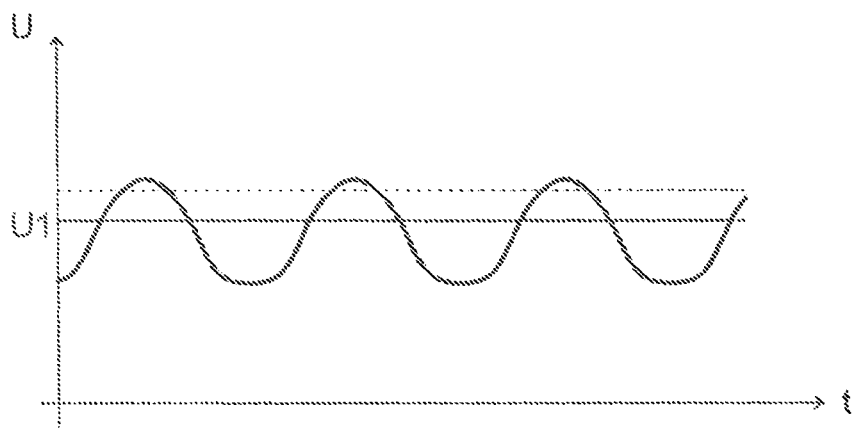
FIG. 11 shows a schematic illustration of a periodic change in an operating voltage of a particle beam apparatus.

Moreover, the operating voltage of the beam generator is swept in method steps S5 to S7. More precisely, the operating voltage in the form of the cathode voltage of the electron source 101 is swept. In method step S5, the cathode voltage is periodically changed by means of the electron source control unit 126 (method step S5). This is illustrated in more detail in FIG. 11. FIG. 11 shows a schematic illustration of the operating voltage in the form of the cathode voltage U as a function of time t. A voltage value U1 set in method step S1 is changed periodically. Here, the period lies, for example, in the range of 0.5 Hz to 3 Hz, in particular in the range from 1 Hz to 2 Hz, with the range boundaries always being included in the aforementioned ranges. By way of example, the maximum amplitude lies in the range from 0.1% to 10% above or below the set operating voltage, but at least up to 100 V above or below the set operating voltage, with the maximum amplitude being the distance between the apex of a maximum of the amplitude and the voltage value U1. The specimen stage 122 is moved into an aligned position of the object 114 during the periodic change in the voltage value U1 of the cathode voltage (method step S6). By way of example, the aligned position is obtained when the area of the object 114 to be imaged is aligned parallel to the individual electrode 112. By way of example, the specimen stage 122 is moved into the aligned position of the object 114 by rotating the specimen stage 122 about the first stage rotation axis 603 and/or about the second stage rotation axis 607. Moving the specimen stage 122 into the aligned position is implemented in such a way that either the image of the object 114 displayed on the monitor 124 does not move or any such movement of the displayed image has a minimal deflection. By way of example, the deflection from the predeterminable zero on the monitor 124 is determined. Subsequently, the periodically changed voltage value is fixed to the voltage value of method step S1 in method step S7.

Therefore, in an embodiment of the system described herein, the magnetic field generated by the objective lens 107 is taken into account. On account of the setting of the second aperture unit 109, the primary electron beam extends along an intended axis of symmetry of the magnetic field. Since the primary electron beam is now guided along the intended axis of symmetry, and hence in a center of the magnetic field, only an asymmetry in the electric field of the objective lens 107 causes a displacement, still present, of the image on the monitor 124 when sweeping the operating voltage. Here, the electric field is the total electric field, which is composed of the first electric field between the individual electrode 112 and the tube electrode 113, and the second electric field between the individual electrode 112 and the object 114. The electric field between the individual electrode 112 and the object 114 is changed by moving the specimen stage 112, and hence by aligning the object 114. As result of this change, the overall deflection of the primary electron beam as a result of the electric fields between the tube electrode 113 and the object 114 is neutralized. The aforementioned method steps S1 to S7 can be repeated multiple times until there is no deflection, or only a minimal deflection, of the image on the monitor 124.

If the objective lens 107A according to FIG. 7 is used in the SEM 100, the statements made above likewise apply.

Figure 12:
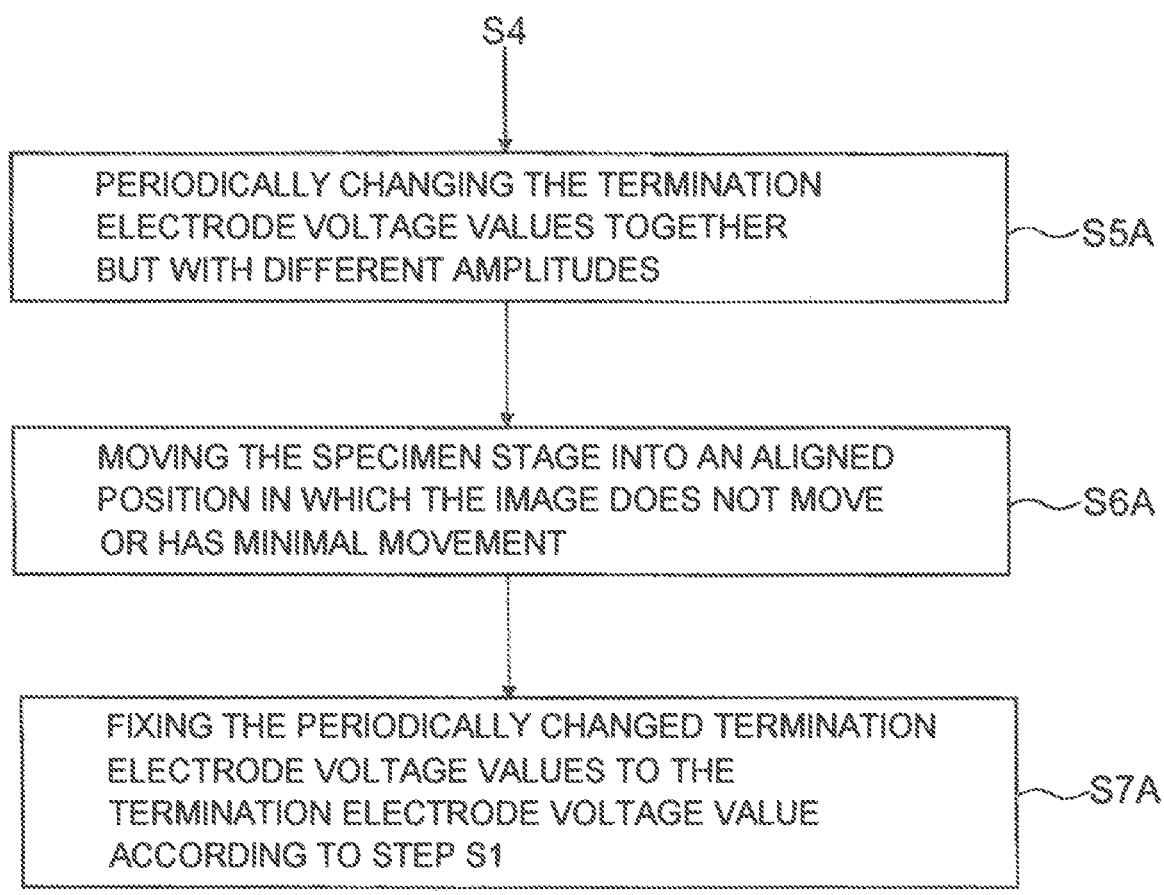
FIG. 12 shows a schematic illustration of a progression of a further method according to an embodiment of the system described herein.

A further illustrative embodiment of the first method for the system described herein has additional method steps S5A to S7A (see FIG. 12). By way of example, the method steps S5A to S7A are carried out after method step S4 according to FIG. 9. By way of example, this further illustrative embodiment of the first method for the system described herein is carried out with the SEM 100 of FIG. 1 or the SEM 100A of FIG. 2, wherein the SEM 100 or the SEM 100A has the objective lens 107A according to FIG. 8. As mentioned above, the individual electrode 112A in the objective lens 107A is a first termination electrode, a first termination electrode voltage being applied thereto, while the electrode 119A is a second termination electrode, a second termination electrode voltage being applied thereto. In the illustrative embodiment illustrated in FIG. 12, the first termination electrode voltage of the individual electrode 112A and the second termination electrode voltage of the electrode 119A are swept, albeit with different amplitudes. The first termination electrode voltage and the second termination electrode voltage have the same termination electrode voltage value AU1. The periodic change in the first termination electrode voltage is now implemented with a first amplitude. Additionally, there is a periodic change in the termination electrode voltage value AU1 of the second termination electrode voltage with a second amplitude. The first amplitude and the second amplitude differ. During the periodic change in the first termination electrode voltage and the second termination electrode voltage, the specimen stage 122 is moved by rotating the specimen stage 122 about the first stage rotation axis 603 and/or about the second stage rotation axis 607 in such a way that either the image of the object 114 displayed on the monitor 124 does not move or any such movement of the image displayed on the monitor 124 has a minimal deflection (method step S6A). By way of example, the deflection from the predeterminable zero on the monitor 124 is determined, once again. Subsequently, the periodically changed termination electrode voltage values are fixed to the termination electrode voltage value of method step S1 in method step S7A.

In particular, provision is made for the first amplitude and the second amplitude to be actuated in such a way that the first amplitude and the second amplitude have a different sign. Further, provision is made for the absolute values of the first amplitude and the second amplitude to differ. The values of the first amplitude and the second amplitude determine the deflecting effect of the first electric field between the individual electrode 112A and the object 114, and of the second electric field between the tube electrode 113A and the individual electrode 112A. Further, additional or alternative provision is made in a further illustrative embodiment of a method for the system described herein for the first amplitude to be actuated in such a way that it has a value of zero. In addition or as an alternative thereto, provision is made for the second amplitude to be actuated in such a way that it has a value of zero. Consequently, either the first termination electrode voltage is zero or the second termination electrode voltage is zero in this illustrative embodiment of a method according to an embodiment of the system described herein.

If the SEM 100A of FIG. 2 is used to carry out the first method according to an embodiment of the system described herein, the object voltage is applied to the object 114 by means of the object voltage control unit 127 in a further illustrative embodiment of the first method according to the system described herein. In this further illustrative embodiment of the first method according to the system described herein, the object voltage is also swept. Expressed differently, the object voltage of the object 114 is set to an object voltage value. Then, there is a periodic change in the object voltage value. Here, the period lies, for example, in the range of 0.5 Hz to 3 Hz, in particular in the range from 1 Hz to 2 Hz, with the range boundaries always being included in the aforementioned ranges. By way of example, the maximum amplitude lies in the range from 0.1% to 10% above or below the set object voltage, but at least up to 100 V above or below the set object voltage, with the maximum amplitude being the distance between the apex of the amplitude and the object voltage value. The specimen stage 122 is moved during the periodic change in the object voltage value. By way of example, the specimen stage 122 is moved by turning the specimen stage 122 about the first stage rotation axis 603 and/or the second stage rotation axis 607. Moving the specimen stage 122 is implemented in such a way that either the image of the object 114 displayed on the monitor 124 does not move or any such movement of the displayed image has a minimal deflection. By way of example, the deflection from the predeterminable zero on the monitor 124 is determined.

Figure 13:
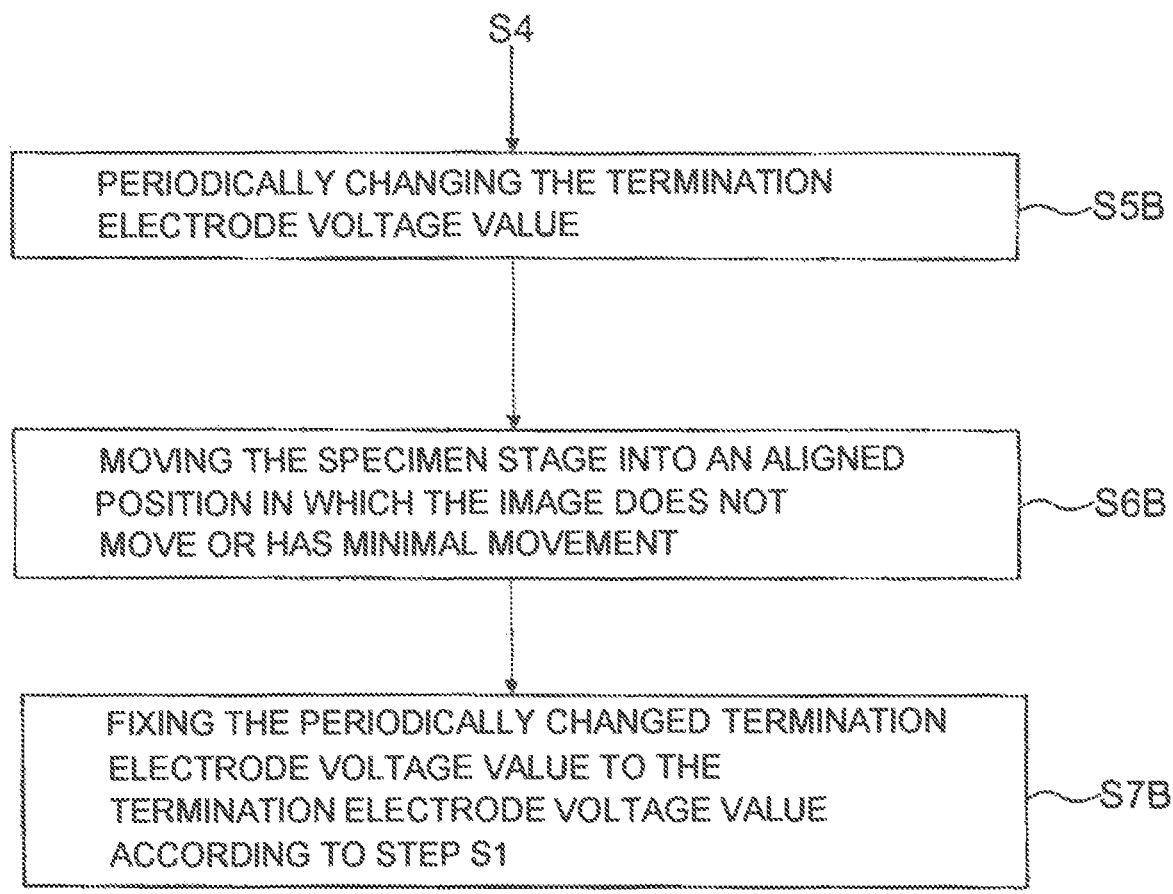
FIG. 13 shows a schematic illustration of a progression of a yet further method.

FIG. 13 shows an illustrative embodiment of a method according to the system described herein, which is carried out using the SEM 100A according to FIG. 2 or the combination apparatus 200 according to FIG. 3, for example. The description below relates to carrying out this method according to an embodiment of the system described herein using the SEM 100A according to FIG. 2. Analogous statements apply in respect of carrying out this method according to the system described herein with the particle beam apparatus specified further above.

Method steps S1 to S4 according to an embodiment of the system described herein correspond to method steps S1 to S4 of an embodiment of the system described herein in relation to FIG. 9. Consequently, the objective lens current I of the objective lens 107 is swept. Reference is made to explanations, provided previously, in respect of method steps S1 to S4 in relation to FIG. 9. In contrast to the illustrative embodiment according to FIG. 9, the termination electrode voltage AU of the individual electrode 112 (i.e., of the termination electrode) is swept in method steps S5B to S7B in the illustrative embodiment according to FIG. 13. Expressed differently, a termination electrode voltage of the individual electrode 112, set to a termination electrode voltage value AU1, is changed periodically in method step S5B by means of the termination electrode control unit 128. Here, the period lies, for example, in the range of 0.5 Hz to 3 Hz, in particular in the range from 1 Hz to 2 Hz, with the range boundaries always being included in the aforementioned ranges. By way of example, the maximum amplitude lies in the range from 0.1% to 10% of the sum of object voltage and anode voltage, but at least up to 100 V, with the maximum amplitude being the distance between the apex of a maximum of the amplitude and the set termination electrode voltage value. The specimen stage 122 is moved during the periodic change in the termination electrode voltage value (method step S6B). By way of example, the specimen stage 122 is moved into the aligned position of the object 114 by turning the specimen stage 122 about the first stage rotation axis 603 and/or the second stage rotation axis 607. Moving the specimen stage 122 into the aligned position is implemented in such a way that either the image of the object 114 displayed on the monitor 124 does not move or any such movement of the displayed image has a minimal deflection (method step S6B). By way of example, the deflection from the predeterminable zero on the monitor 124 is determined. Subsequently, the periodically changed termination electrode voltage value is fixed to the termination electrode voltage value of method step S1 in method step S7B. Therefore, in some embodiments of the system described herein, the magnetic field generated by the objective lens 107 is taken into account in a first step. On account of the setting of the second aperture unit 109, the primary electron beam extends along an intended axis of symmetry of the magnetic field. Since the primary electron beam is now already guided along the intended axis of symmetry, and hence in a center of the magnetic field, only an asymmetry in the electric field between the objective lens 107 and the object 114 causes a displacement, still present, of the image on the monitor 124 when sweeping the termination electrode voltage. Now, this electric field is taken into account by aligning the specimen stage 122 in a second step of this method according to an embodiment of the system described herein. The aforementioned method steps, i.e., sweeping the objective lens current I, setting the second aperture unit 109, sweeping the termination electrode voltage AU and positioning the specimen stage 122, can be repeated multiple times until there is no deflection, or only a minimal deflection, of the image on the monitor 124.

Figure 14A:
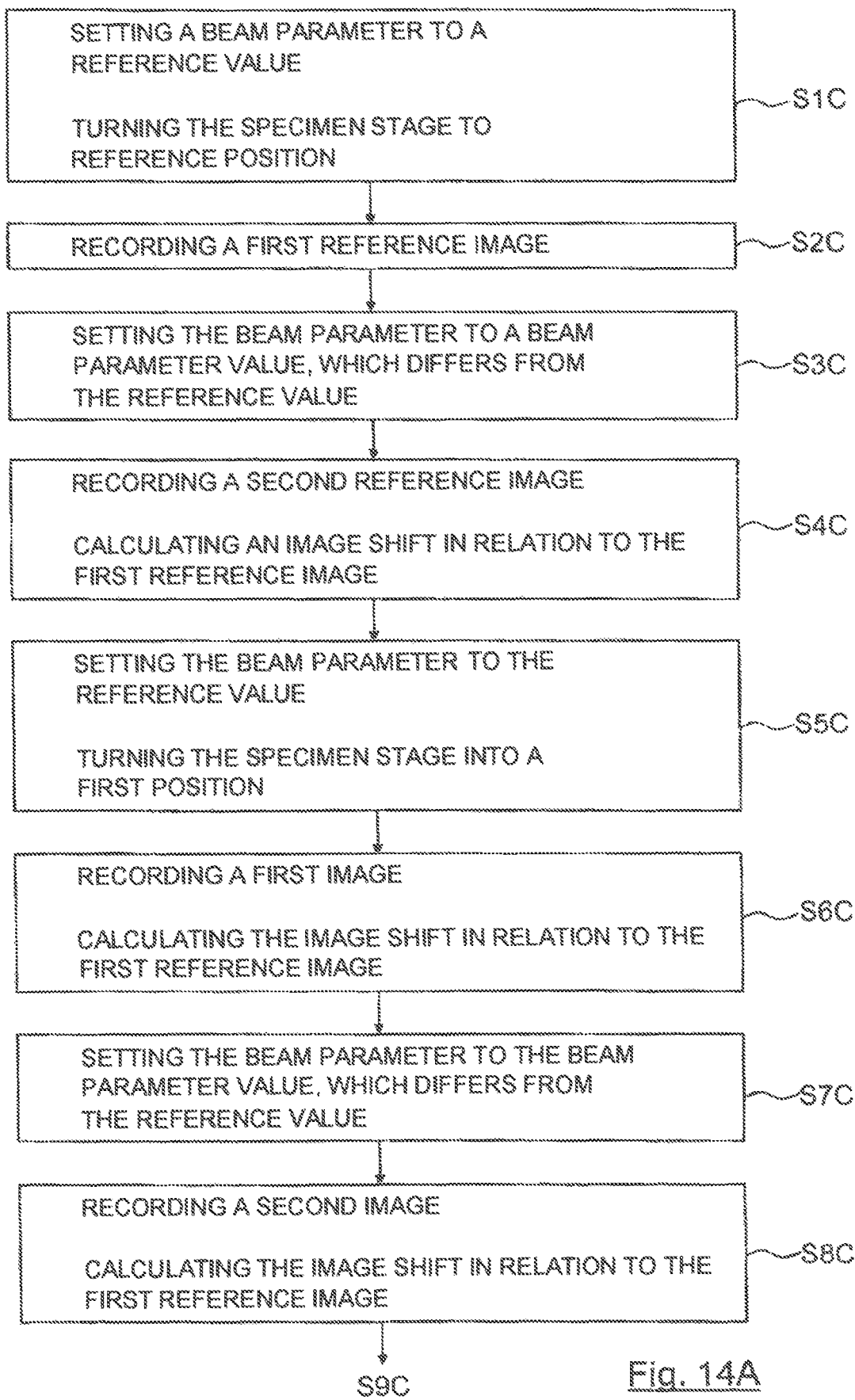
FIGS. 14A/B show a schematic illustration of a progression of an even further method according to an embodiment of the system described herein.
Figure 14B:
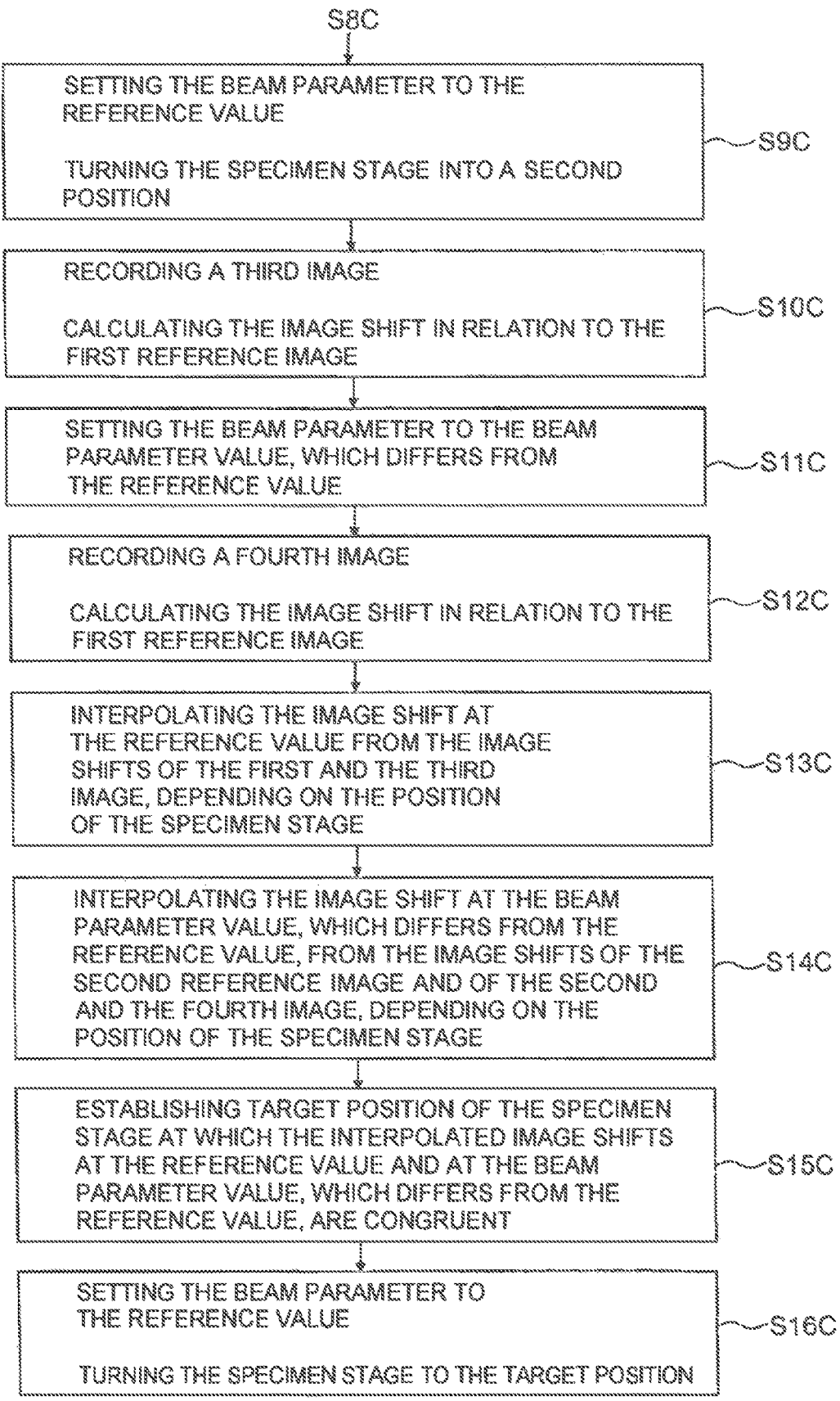

FIGS. 14A and 14B show an illustrative embodiment of a yet further method, which is implemented, for example, with the SEM 100 according to FIG. 1, with the SEM 100A according to FIG. 2, with the combination apparatus 200 according to FIG. 3 and/or with the particle beam apparatus 400 according to FIG. 4. The description below relates to carrying out the yet further method using the SEM 100 according to FIG. 1. Analogous statements apply in respect of carrying out the yet further method with the further aforementioned particle beam apparatuses and/or explicit reference thereto is made below.

In method step S1C, a beam parameter is set to a reference value by means of a control unit. By way of example, the reference value is a zero value or a zero. By way of example, the control unit is the electron source control unit 126 for supplying the beam generator in the form of the electrode source 101 with an operating voltage in the form of the cathode voltage and for setting the cathode voltage. Then, the beam parameter is the cathode voltage. If the yet further method is performed using the SEM 100A of FIG. 2, then provision is made, for example, for the control unit to be the termination electrode control unit 128 for supplying the termination electrode 112, 119 with the termination electrode voltage and for setting the termination electrode voltage. Then, the beam parameter is the termination electrode voltage.

The specimen stage 122 is also turned to a predeterminable reference position in method step S1C. By way of example, the specimen stage 122 is turned by turning the specimen stage 122 about the first stage rotation axis 603 and/or about the second stage rotation axis 607 into the reference position.

A first reference image of the object 114 in the reference position is recorded in method step S2C. Thereupon, in method step S3C, the beam parameter is set to a beam parameter value, which differs from the reference value. By way of example, setting is implemented by one of the aforementioned control units provided for setting the corresponding beam parameter.

Thereupon, a second reference image of the object 114 in the reference position is recorded in method step S4C. Consequently, both the first reference image and the second reference image are recorded in the reference position of the specimen stage 122; however, these are recorded with different beam parameter values, namely, firstly, with the reference value and, secondly, with the beam parameter value, which differs from the reference value.

Then, an image shift of the second reference image in relation to the first reference image is also calculated in method step S4C. By way of example, the image shift is calculated by means of a cross-correlation.

The beam parameter is set to the reference value again in a further method step S5C. Further, the specimen stage 122 is turned into a first position. By way of example, turning is implemented about the first stage rotation axis 603 and/or about the second stage rotation axis 607. Now, in method step S6C, a first image of the object 114 is recorded in the first position of the specimen stage 122. Thereupon, the image shift of the first image in relation to the first reference image is calculated. By way of example, the shift of the first image in relation to the first reference image is determined by means of a cross-correlation.

Following this, in method step S7C, the beam parameter is set to the beam parameter value, which differs from the reference value, again. Thereupon, in method step S8C, a second image of the object 114 is recorded in the first position of the specimen stage 122 in method step S8C. Further, the image shift of the second image in relation to the first reference image is calculated. Here, too, the image shift of the second image in relation to the first reference image is determined by means of a cross-correlation, for example.

Now, the beam parameter is set to the reference value again in method step S9C. Now, the specimen stage 122 is turned into a second position. By way of example, the second position is set by turning the specimen stage 122 about the first stage rotation axis 603 and/or about the second stage rotation axis 607. Thereupon, in method step S10C, a third image of the object 114 is recorded in the second position. Further, the image shift of the third image in relation to the first reference image is calculated, wherein the image shift of the third image in relation to the first reference image is calculated by means of a cross-correlation, for example.

Now, in method step S11C, the beam parameter is set to the beam parameter value, which differs from the reference value, again. Thereupon, in method step S12C, a fourth image of the object 114 is recorded in the second position. Further, the image shift of the fourth image in relation to the first reference image is calculated, wherein, for example, the image shift of the fourth image in relation to the first reference image is calculated by means of a cross-correlation.

Now, from the image shifts of the first image and of the third image, the image shifts at the reference value are interpolated in method step S13C, depending on the position of the specimen stage 122. Further, from the image shifts of the second reference image, of the second image and of the fourth image, the image shifts at the beam parameter value, which differs from the reference value, are interpolated in method step S14C, depending on the position of the specimen stage 122.

A target position of the specimen stage 122 is established in method step S15C, the interpolated image shifts at the reference value and at the beam parameter value, which differs from the reference value, being congruent at said target position. Now, in method step S16C, the beam parameter is set to the reference value again. Now, the specimen stage 122 is turned to the established target position by turning the specimen stage 122 about the first stage rotation axis 603 and/or about the second stage rotation axis 607.

This method is particularly well-suited for automation since no value is continuously periodically changed in this method; instead, a few discrete values of a parameter are set and established.

The features of the system described herein disclosed in the present description, in the drawings and in the claims may be essential for the realization of the system described herein in the various embodiments thereof, both individually and in arbitrary combinations. The system described herein is not restricted to the described embodiments. It may be varied within the scope of the claims, taking into account the knowledge of the relevant person skilled in the art. Other embodiments of the system described herein will be apparent to those skilled in the art from a consideration of the specification and/or an attempt to put into practice the system described herein disclosed herein. It is intended that the specification and examples be considered as illustrative only, with the true scope and spirit of the invention being indicated by the following claims.

The invention claimed is:

1. A method for operating a particle beam apparatus comprising:
    at least one beam generator for generating a particle beam comprising charged primary particles,
    at least one objective lens for focusing the particle beam onto the object, wherein interaction particles and/or interaction radiation arise/arises in the case of an interaction of the particle beam with the object, wherein the objective lens generates a magnetic field and an electric field at least partly between the beam generator and the object,
    at least one adjustable deflection unit for deflecting the particle beam and/or at least one adjustable aperture unit for forming the particle beam,
    at least one movable specimen stage for arranging the object in the particle beam apparatus,
    at least one detector for detecting the interaction particles and/or interaction radiation and for generating detector signals,
    at least one display device for displaying an image of the object, wherein the image is generated by means of the detector signals,
    at least one objective lens control unit for supplying the objective lens with an objective lens current and for setting the objective lens current, and
    at least one beam generator control unit for supplying the beam generator with an operating voltage and for setting the operating voltage,
    wherein the method comprises:
        setting the objective lens current to a current value by means of the objective lens control unit and periodically changing the current value of the objective lens current by means of the objective lens control unit;
        setting at least one of the following properties of the deflection unit and/or of the aperture unit during the periodic change of the objective lens current: (i) a position of the deflection unit and/or the aperture unit in the particle beam apparatus and (ii) at least one actuation variable for supplying the deflection unit and/or aperture unit, wherein setting is implemented in such a way that either the image of the object displayed on the display device does not move or any such movement of the displayed image has a minimal deflection;
        setting the operating voltage to a voltage value by means of the beam generator control unit and periodically changing the voltage value of the operating voltage by means of the beam generator control unit; and
        moving the specimen stage into a position of the object during the periodic change in the voltage value of the operating voltage in such a way that either the image of the object displayed on the display device does not move or any such movement of the displayed image has a minimal deflection.

2. The method as claimed in claim 1, wherein the operating voltage is supplied to a cathode of the beam generator and the operating voltage in the form of a cathode voltage is set by the beam generator control unit.

3. The method as claimed in claim 1, wherein a controllable object voltage is applied to the object.

4. A method for operating a particle beam apparatus comprising:
    at least one beam generator for generating a particle beam comprising charged primary particles,
    at least one objective lens for focusing the particle beam onto the object, wherein interaction particles and/or interaction radiation arise/arises in the case of an interaction of the particle beam with the object and wherein the objective lens has at least one termination electrode,
    at least one adjustable deflection unit for deflecting the particle beam and/or at least one adjustable aperture unit for forming the particle beam,
    at least one movable specimen stage for arranging the object in the particle beam apparatus,
    at least one detector for detecting the interaction particles and/or interaction radiation and for generating detector signals,
    at least one display device for displaying an image of the object, wherein the image is generated by means of the detector signals,
    at least one objective lens control unit for supplying the objective lens with an objective lens current and for setting the objective lens current, and
    at least one termination electrode control unit for supplying the termination electrode with a termination electrode voltage and for setting the termination electrode voltage, wherein the method comprises:
        setting the objective lens current to a current value by means of the objective lens control unit and periodically changing the current value of the objective lens current by means of the objective lens control unit;
        setting at least one of the following properties of the deflection unit and/or of the aperture unit during the periodic change of the objective lens current: (i) a position of the deflection unit and/or the aperture unit in the particle beam apparatus and (ii) at least one actuation variable for supplying the deflection unit and/or the aperture unit, wherein setting is implemented in such a way that either the image of the object displayed on the display device does not move or any such movement of the displayed image has a minimal deflection;

setting the termination electrode voltage to a termination electrode voltage value by means of the termination electrode control unit and periodically changing the termination electrode voltage value of the termination electrode voltage by means of the termination electrode control unit; and moving the specimen stage into an aligned position of the object during the periodic change in the termination electrode voltage in such a way that either the image of the object displayed on the display device does not move or any such movement of the displayed image has a minimal deflection.

5. The method as claimed in claim 4, wherein the termination electrode is a first termination electrode, wherein the objective lens has a second termination electrode and wherein the method further comprises:

implementing the periodic change in the termination electrode voltage value of the first termination electrode voltage with a first amplitude; and setting a second termination electrode voltage of the second termination electrode of the objective lens to the termination electrode voltage value and periodically changing the termination electrode voltage value of the second termination electrode voltage with a second amplitude, wherein the movement of the specimen stage is implemented both during the periodic change in the first termination electrode voltage of the first termination electrode and during the periodic change in the second termination electrode voltage of the second termination electrode.

6. The method as claimed in claim 5, wherein the method further comprises:

actuating the first amplitude and the second amplitude in such a way that the first amplitude and the second amplitude have a different sign.

7. The method as claimed in claim 5, wherein the method comprises one of the following:

actuating the first amplitude in such a way that the first amplitude has a value of zero; or actuating the second amplitude in such a way that the second amplitude has a value of zero.

8. The method as claimed in claim 4, wherein a controllable object voltage is applied to the object.

9. A method for operating a particle beam apparatus comprising:

at least one beam generator for generating a particle beam comprising charged primary particles, at least one objective lens for focusing the particle beam onto the object, wherein interaction particles and/or interaction radiation arise/arises in the case of an interaction of the particle beam with the object, wherein the objective lens has at least one termination electrode, at least one movable specimen stage for arranging the object in the particle beam apparatus, wherein the specimen stage is rotatable about a first axis and/or a second axis and wherein the first axis is arranged perpendicular to the second axis, at least one detector for detecting the interaction particles and/or interaction radiation and for generating detector signals, at least one display device for displaying an image of the object on the basis of the detector signals, and at least one control unit for setting a beam parameter, wherein the method comprises:

recording reference images in a reference position of the specimen stage, including the following steps:

recording a first reference image of the object in the reference position of the specimen stage with a beam parameter having a value corresponding to a reference value;

recording a second reference image of the object in the reference position of the specimen stage with the beam parameter having a beam parameter value, which differs from the reference value; and calculating an image shift of the second reference image in relation to the first reference image;

recording images in a first position of the specimen stage, including the following steps:

recording a first image of the object in the first position of the specimen stage with the beam parameter having a value corresponding to the reference value;

recording a second image of the object in the first position of the specimen stage with the beam parameter having the beam parameter value, which differs from the reference value; and calculating an image shift of the first image in relation to the first reference image and calculating an image shift of the second image in relation to the first reference image;

recording images in a second position of the specimen stage, including the following steps:

recording a third image of the object in the second position of the specimen stage with the beam parameter having a value corresponding to the reference value;

recording a fourth image of the object in the second position of the specimen stage with the beam parameter having the beam parameter value, which differs from the reference value; and calculating an image shift of the third image in relation to the first reference image and calculating an image shift of the fourth image in relation to the first reference image;

interpolating the image shifts of the first image and third image, each recorded at the reference value, in relation to the first reference image depending on the position of the specimen stage;

interpolating the image shifts of the second reference image, the second image and the fourth image, each recorded at the beam parameter value, in relation to the first reference image depending on the position of the specimen stage, wherein the beam parameter value differs from the reference value;

establishing a target position of the specimen stage, in which the interpolated image shifts at the reference value and at the beam parameter value, which differs from the reference value, are identical; and operating the particle beam apparatus with the beam parameter having a value corresponding to the reference value and with the specimen stage arranged in the target position.

10. The method as claimed in claim 9, including at least one of the following steps:

setting the beam parameter to the reference value;

setting the beam parameter to the beam parameter value, which differs from the reference value;

setting the reference position of the specimen stage by rotating the specimen stage about the first axis and/or about the second axis;

setting the first position of the specimen stage by rotating the specimen stage about the first axis and/or about the second axis; and setting the second position of the specimen stage by rotating the specimen stage about the first axis and/or about the second axis.

11. The method as claimed in claim 9, wherein the control unit is an objective lens control unit for supplying the objective lens with an objective lens current and for setting the objective lens current, and wherein the beam parameter is the objective lens current.

12. The method as claimed in claim 9, wherein the control unit is a beam generator control unit for supplying the beam generator with an operating voltage and for setting the operating voltage, and wherein the beam parameter is the operating voltage.

13. The method as claimed in claim 9, wherein the control unit is a termination electrode control unit for supplying the termination electrode with a termination electrode voltage and for setting the termination electrode voltage, and wherein the beam parameter is the termination electrode voltage.

14. The method as claimed in claim 9, wherein the control unit is a deflection control unit for supplying a deflection unit with a controlled variable and for setting the controlled variable, and wherein the beam parameter is the controlled variable.

15. The method as claimed in claim 9, wherein the method comprises the following steps:
recording a further image of the object at a further position of the specimen stage with the beam parameter having the value corresponding to the reference value;
recording an even further image of the object with the beam parameter, which has the value, which differs from the reference value;
calculating an image shift of the further image in relation to the first reference image;
calculating an image shift of the even further image in relation to the first reference image;
interpolating the image shift of the further image in relation to the first reference image depending on the further position of the specimen stage, taking account of the interpolation as claimed in claim 9;
interpolating the image shift of the even further image in relation to the first reference image depending on the further position of the specimen stage, taking account of the interpolation as claimed in claim 9;
establishing a further target position of the specimen stage, in which the interpolated image shifts at the reference value and at the beam parameter value, which differs from the reference value, are identical; and
operating the particle beam apparatus with the beam parameter having a value corresponding to the reference value and with the specimen stage arranged in the further target position.

16. A computer program product having program code, which may be loaded into a processor of a particle beam apparatus comprising:
at least one beam generator for generating a particle beam comprising charged primary particles,
at least one objective lens for focusing the particle beam onto the object, wherein interaction particles and/or interaction radiation arise/arises in the case of an interaction of the particle beam with the object, wherein the objective lens generates a magnetic field and an electric field at least partly between the beam generator and the object,
at least one adjustable deflection unit for deflecting the particle beam and/or at least one adjustable aperture unit for forming the particle beam,
at least one movable specimen stage for arranging the object in the particle beam apparatus,
at least one detector for detecting the interaction particles and/or interaction radiation and for generating detector signals,
at least one display device for displaying an image of the object, wherein the image is generated by means of the detector signals,
at least one objective lens control unit for supplying the objective lens with an objective lens current and for setting the objective lens current, and
at least one beam generator control unit for supplying the beam generator with an operating voltage and for setting the operating voltage,
wherein the program code, when executed, controls the particle beam apparatus in such a way that a method is carried out, the method comprising:
setting the objective lens current to a current value by means of the objective lens control unit and periodically changing the current value of the objective lens current by means of the objective lens control unit;
setting at least one of the following properties of the deflection unit and/or of the aperture unit during the periodic change of the objective lens current: (i) a position of the deflection unit and/or the aperture unit in the particle beam apparatus and (ii) at least one actuation variable for supplying the deflection unit and/or aperture unit, wherein setting is implemented in such a way that either the image of the object displayed on the display device does not move or any such movement of the displayed image has a minimal deflection;
setting the operating voltage to a voltage value by means of the beam generator control unit and periodically changing the voltage value of the operating voltage by means of the beam generator control unit; and
moving the specimen stage into a position of the object during the periodic change in the voltage value of the operating voltage in such a way that either the image of the object displayed on the display device does not move or any such movement of the displayed image has a minimal deflection.

17. A particle beam apparatus for imaging and/or for processing an object, comprising:
at least one beam generator for generating a particle beam comprising charged primary particles;
at least one objective lens for focusing the particle beam onto the object, wherein interaction particles and/or interaction radiation arise/arises in the case of an interaction of the particle beam with the object, wherein the objective lens has at least one termination electrode;
at least one adjustable deflection unit for deflecting the particle beam and/or at least one adjustable aperture unit for forming the particle beam;
at least one movable specimen stage for arranging the object in the particle beam apparatus;
at least one detector for detecting the interaction particles and/or interaction radiation and for generating detector signals;
at least one display device for displaying an image of the object on the basis of the detector signals;

at least one objective lens control unit for supplying the objective lens with an objective lens current and for setting the objective lens current;

at least one beam generator control unit for supplying the beam generator with an operating voltage and for setting the operating voltage;

at least one termination electrode control unit for supplying the termination electrode with a termination electrode voltage and for setting the termination electrode voltage;

at least one deflection control unit for supplying the deflection unit and/or the aperture unit with an actuation variable and for setting the actuation variable; and a processor having program code of a computer program product loaded therein, wherein the program code controls the particle beam apparatus in such a way that a method is carried out, the method comprising:

setting the objective lens current to a current value by means of the objective lens control unit and periodically changing the current value of the objective lens current by means of the objective lens control unit;

setting at least one of the following properties of the deflection unit and/or of the aperture unit during the periodic change of the objective lens current: (i) a position of the deflection unit and/or the aperture unit in the particle beam apparatus and (ii) at least one actuation variable for supplying the deflection unit and/or aperture unit, wherein setting is implemented in such a way that either the image of the object displayed on the display device does not move or any such movement of the displayed image has a minimal deflection;

setting the operating voltage to a voltage value by means of the beam generator control unit and periodically changing the voltage value of the operating voltage by means of the beam generator control unit; and moving the specimen stage into a position of the object during the periodic change in the voltage value of the operating voltage in such a way that either the image of the object displayed on the display device does not move or any such movement of the displayed image has a minimal deflection.

18. The particle beam apparatus as claimed in claim 17, wherein the beam generator has a cathode and wherein the operating voltage is a cathode voltage supplied to the cathode by the beam generator control unit.

19. The particle beam apparatus as claimed in claim 17, wherein the particle beam apparatus has an object voltage control unit for supplying the object with an object voltage.

20. The particle beam apparatus as claimed in claim 17, wherein the particle beam apparatus has at least one corrector for correcting chromatic and/or spherical aberration.

21. The particle beam apparatus as claimed in claim 20, wherein the corrector is a mirror corrector.

22. The particle beam apparatus as claimed in claim 17, wherein the particle beam apparatus is designed as an electron beam apparatus and/or as an ion beam apparatus.

23. The particle beam apparatus as claimed in claim 17, wherein the beam generator for generating a particle beam comprising charged primary particles is embodied as a first beam generator for generating a first particle beam comprising first charged primary particles and the objective lens is embodied as a first objective lens for focusing the first particle beam, and wherein the particle beam apparatus further comprises:

at least one second beam generator for generating a second particle beam comprising second charged primary particles; and at least one second objective lens for focusing the second particle beam onto the object.

* * * * *